US012812975B2

(12) United States Patent
Lee et al.

(10) Patent No.: US 12,812,975 B2

(45) Date of Patent: Nov. 24, 2026

(54) DISPLAY DEVICE WHICH REDUCES NUMBER OF INTERSECTIONS OF SCAN LINES AND DATA LINES

(71) Applicant: Samsung Display Co., Ltd., Yongin-Si (KR)

(72) Inventors: Seong Young Lee, Hwaseong-si (KR); Kyung Ho Kim, Seongnam-si (KR); Ki Won Park, Hwaseong-si (KR); Soo Hong Cheon, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/420,768

(22) Filed: Jan. 24, 2024

(65) Prior Publication Data

US 2024/0186335 A1 Jun. 6, 2024

Related U.S. Application Data

(62) Division of application No. 17/109,606, filed on Dec. 2, 2020, now Pat. No. 11,929,370.

(30) Foreign Application Priority Data

Apr. 27, 2020 (KR) ........................ 10-2020-0050719

(51) Int. Cl.

*H10D 86/60* (2025.01)

*G02F 1/136* (2006.01)

(Continued)

(52) U.S. Cl.

CPC ....... *H10D 86/60* (2025.01); *G02F 1/136286* (2013.01); *H10D 86/443* (2025.01);

(Continued)

(58) Field of Classification Search

CPC ......... G02F 1/136286; G02F 1/136213; G02F 1/136227

See application file for complete search history.

(56) References Cited

U.S. PATENT DOCUMENTS 7,855,405 B2 12/2010 Kim 8,564,754 B2 10/2013 Kim et al.

(Continued)

FOREIGN PATENT DOCUMENTS

CN 104483790 A 4/2015

CN 106980215 A 7/2017

(Continued)

OTHER PUBLICATIONS

Korean Notice of Allowance corresponding to Application No. 10-2020-0050719 and issued on May 26, 2025, 3 pages.

(Continued)

*Primary Examiner* — Lauren Nguyen

(74) *Attorney, Agent, or Firm* — Innovation Counsel LLP

(57) ABSTRACT

Embodiments of the current disclosure to provide a display device which can reduce the number of intersections of scan lines and data lines. According to an embodiment of the disclosure, a display device comprises: a substrate; scan lines extending along a first direction; data lines extending along a second direction that intersect the first direction; a first switching element; a first pixel electrode connected to a first source electrode of the first switching element; a second switching element; and a second pixel electrode connected to a second source electrode of the second switching element. The first pixel electrode and the second pixel electrode are disposed along the second direction, and a first source electrode and a first drain electrode of the first (Continued)

switching element extend along the second direction in an area overlapping a first active layer of the first switching element.

7 Claims, 18 Drawing Sheets

(51) Int. Cl.
*G02F 1/1362* (2006.01)
*G02F 1/1368* (2006.01)
*H10D 86/40* (2025.01)

(52) U.S. Cl.
CPC ....... *H10D 86/481* (2025.01); *G02F 1/13606* (2021.01); *G02F 1/136227* (2013.01); *G02F 1/1368* (2013.01)

(56) References Cited

U.S. PATENT DOCUMENTS

| | | | | |
|---|---|---|---|---|
| 8,773,605 | B2 | 7/2014 | Kim et al. | |
| 8,804,080 | B2 | 8/2014 | Jang et al. | |
| 9,323,122 | B2 | 4/2016 | Jiang et al. | |
| RE47,455 | E | 6/2019 | Kim et al. | |
| 10,684,521 | B2 | 6/2020 | Shin et al. | |
| 11,036,103 | B2 | 6/2021 | Seo | |
| RE49,271 | E | 11/2022 | Kim et al. | |
| 2010/0001276 | A1* | 1/2010 | Kim | G02F 1/136227 257/E27.06 |
| 2011/0047792 | A1* | 3/2011 | Lee | H01L 27/124 29/825 |
| 2015/0085215 | A1 | 3/2015 | Yoshida | |
| 2016/0202583 | A1 | 7/2016 | Jung et al. | |
| 2017/0205677 | A1 | 7/2017 | Seo | |
| 2019/0227399 | A1 | 7/2019 | Shin et al. | |
| 2020/0117062 | A1 | 4/2020 | Kim et al. | |

FOREIGN PATENT DOCUMENTS

| | | | |
|---|---|---|---|
| CN | 110068966 | A | 7/2019 |
| CN | 111045258 | A | 4/2020 |
| KR | 10-2008-0110093 | A | 12/2008 |
| KR | 10-2012-0004045 | A | 1/2012 |
| KR | 10-2012-0111684 | A | 10/2012 |
| KR | 10-2013-0016922 | A | 2/2013 |
| KR | 10-2013-0067443 | A | 6/2013 |
| KR | 10-2014-0100383 | A | 8/2014 |
| KR | 10-2015-0002254 | A | 1/2015 |
| KR | 10-2017-0086748 | A | 7/2017 |
| KR | 10-1994271 | B1 | 7/2019 |
| KR | 10-2019-0090410 | A | 8/2019 |
| KR | 10-2020-0041410 | A | 4/2020 |

OTHER PUBLICATIONS

Chinese Office Action corresponding to Application No. 202110348591.1, dated on Jul. 7, 2025, 9 pages.

* cited by examiner

DISPLAY DEVICE WHICH REDUCES NUMBER OF INTERSECTIONS OF SCAN LINES AND DATA LINES

CROSS-REFERENCE TO RELATED APPLICATION

This application is a divisional application of U.S. patent application Ser. No. 17/109,606 filed on Dec. 2, 2020, which claims priority to Korean Patent Application No. 10-2020-0050719 filed on Apr. 27, 2020, and all the benefits accruing therefrom under 35 U.S.C. § 119, the content of which in its entirety is herein incorporated by reference.

BACKGROUND

1. Field of the Disclosure

The disclosure relates to a display device.

2. Description of the Related Art

Liquid crystal displays (LCDs) are one of the most widely used types of display devices. An LCD includes a pair of substrates having pixel electrodes and a common electrode and a liquid crystal layer interposed between the two substrates. In the LCD, voltages are applied to the pixel electrodes and the common electrode to generate an electric field in the liquid crystal layer, thereby driving liquid crystal molecules of the liquid crystal layer and controlling the polarization of incident light. As a result, an image is displayed on the LCD.

To apply voltages to the pixel electrodes, the LCD may include scan lines extending in a direction, data lines extending in the other direction intersecting the direction, and subpixels connected to the scan lines and the data lines, respectively. Each of the subpixels is turned on by a scan signal of a scan line to connect a pixel electrode to a data line. In the LCD, the scan lines and the data lines inevitably intersect each other, but a short circuit is highly likely to occur between a scan line and a data line due to particles at intersections of the scan lines and the data lines.

SUMMARY

Embodiments of the current disclosure to provide a display device which can reduce the number of intersections of scan lines and data lines.

According to an embodiment of the disclosure, a display device comprises: a substrate; scan lines disposed on the substrate and extending along a first direction; data lines disposed on the substrate and extending along a second direction that intersects the first direction; a first switching element including a first active area, a first gate electrode connected to a first scan line among the scan lines, a first drain electrode connected to a first data line among the data lines, and a first source electrode facing the first drain electrode; a first pixel electrode connected to the first source electrode of the first switching element; a second switching element including a second active area, a second gate electrode connected to the first scan line, a second drain electrode connected to a second data line among the data lines, and a second source electrode facing the second drain electrode; and a second pixel electrode connected to the second source electrode of the second switching element. The first pixel electrode and the second pixel electrode are disposed along the second direction, and the first source electrode and the first drain electrode extend along the second direction in an area overlapping the first active layer of the first switching element.

According to an embodiment of the disclosure, a display device comprises: a substrate; scan lines disposed on the substrate and extending along a first direction; data lines disposed on the substrate and extending along a second direction that intersects the first direction; a first switching element including a first active area, a first gate electrode connected to a first scan line among the scan lines, a first drain electrode connected to a first data line among the data lines, and a first source electrode facing the first drain electrode; a first pixel electrode connected to the first source electrode of the first switching element through a first contact hole; a second switching element including a second active area, a second gate electrode connected to the first scan line, a second drain electrode connected to a second data line among the data lines, and a second source electrode facing the first drain electrode; and a second pixel electrode connected to the second source electrode of the second switching element through a second contact hole. The first switching element overlaps the first contact hole in the second direction, and the second switching element overlaps the second contact hole in the second direction.

According to an embodiment of the disclosure, a display device comprises: a substrate; scan lines disposed on the substrate and extending along a first direction; data lines disposed on the substrate and extending along a second direction that intersects the first direction; a first switching element including a first active area, a first gate electrode connected to a first scan line among the scan lines, a first drain electrode connected to a first data line among the data lines, and a second source electrode facing the first drain electrode; a first pixel electrode connected to the first source electrode of the first switching element; a first source connector which extends from the first source electrode and is connected to the first pixel electrode through a first contact hole; and a first storage electrode which overlaps the first source connector in a plan view. One edge of the first storage electrode protrudes further in the first direction or the second direction than one edge of the first source connector.

According to an embodiment of the disclosure, short circuits between storage lines and data lines due to particles can be reduced by reducing the number of intersections of the storage lines and the data lines. Therefore, the manufacturing yield of a display panel can be increased.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
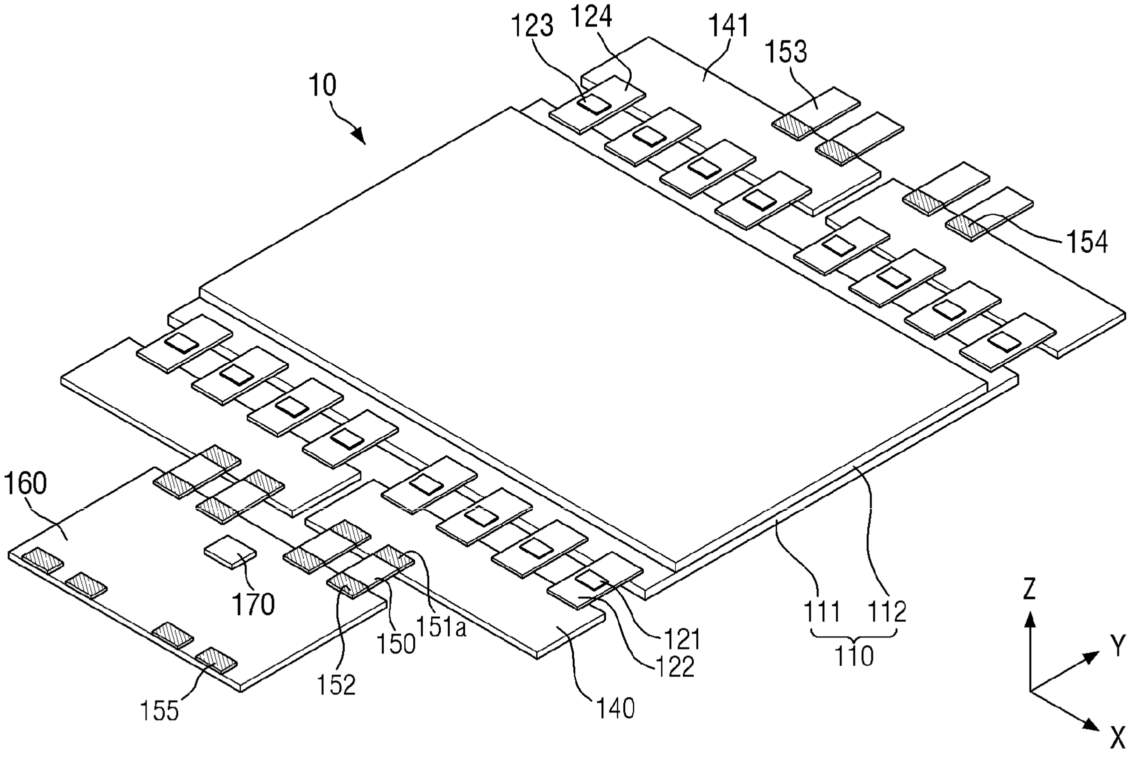
FIG. 1 is a perspective view of a display device according to an embodiment.

The inventive concept now will be described more fully hereinafter with reference to the accompanying drawings, in which various embodiments are shown. This inventive concept may, however, be embodied in many different forms, and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise.

"Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the inventive concept present disclosure will be described in detail with reference to the accompanying drawings.

FIG. 1 is a perspective view of a display device 10 according to an embodiment.

Referring to FIG. 1, the display device 10 according to the embodiment is a device for displaying moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and the Internet of things (IoT).

The display device 10 according to the embodiment may be an LCD display device, a light emitting display device such as an organic light emitting display device using organic light emitting diodes, a quantum dot light emitting display device including quantum dot light emitting layers, an inorganic light emitting display device including inorganic semiconductors, or a micro light emitting display device using micro light emitting diodes. A case where the display device 10 is an organic light emitting display device will be mainly described below, but the present disclosure is not limited thereto.

The display device 10 according to the embodiment includes a display panel 110, first source driving circuits 121, first flexible films 122, second source driving circuits 123, second flexible films 124, first source circuit boards 140, second source circuit boards 141, first cables 150, second cables 153, a control circuit board 160, and a timing control circuit 170.

The display panel 110 may be rectangular in a plan view. For example, the display panel 110 may have a rectangular planar shape having short sides in a first direction (X-axis direction) and long sides in a second direction (Y-axis direction). Each corner where a short side extending in the first direction (X-axis direction) meets a long side extending in the second direction (Y-axis direction) may be right-angled or may be rounded with a predetermined curvature. The planar shape of the display panel 110 is not limited to the rectangular shape, but may also be another polygonal shape, a circular shape, or an oval shape. Although the display panel 110 is formed flat in FIG. 1, the present disclosure is not limited thereto. The display panel 110 may also be bent with a predetermined curvature.

The display panel 110 may include a first substrate 111 and a second substrate 112. The first substrate 111 and the second substrate 112 may be made of glass or plastic. The display panel 110 may be implemented as a liquid crystal display panel including a liquid crystal layer disposed between the first substrate 111 and the second substrate 112. A lower polarizing film may be disposed on an outer surface of the first substrate 111, and an upper polarizing film may be disposed on an outer surface of the second substrate 112.

The display panel 110 may be a display panel with high resolution such as 4K ultra-high definition (UHD) or 8K UHD. 4K UHD refers to a resolution of 3840×2160, and 8K UHD refers to a resolution of 7680×4320. 8K UHD has resolution four times higher than 4K UHD.

A length of the second substrate 112 in the second direction (Y-axis direction) may be smaller than a length of the first substrate 111 in the second direction (Y-axis direction). Therefore, a surface of the first substrate 111 on a first side and a second side of the display panel 110 may be exposed without being covered by the second substrate 112. The second side of the display panel 110 may be opposite the first side of the display panel 110 in the second direction (Y-axis direction). In the present specification, a case where the first side of the display panel 110 is a lower side of the display panel 110 and the second side of the display panel 110 is an upper side of the display panel 110 as illustrated in FIG. 1 will be mainly described.

A first scan driver 131 (see FIG. 3) of a scan driver 130 (see FIG. 2) may be disposed on a third side of the display panel 110, and a second scan driver 132 (see FIG. 3) of the scan driver 130 (see FIG. 2) may be disposed on a fourth side of the display panel 110. The fourth side of the display panel 110 may be opposite the third side of the display panel 110 in the first direction (X-axis direction). In the present specification, a case where the third side of the display panel 110 is a left side of the display panel 110 and the fourth side of the display panel 110 is a right side of the display panel 110 as illustrated in FIG. 1 will be mainly described.

The first scan driver 131 (see FIG. 3) may generate first scan signals in response to a first scan control signal of the timing control circuit 170 and sequentially output the first scan signals to scan lines of the display panel 110. The second scan driver 132 (see FIG. 3) may generate second scan signals in response to a second scan control signal of the timing control circuit 170 and sequentially output the second scan signals to the scan lines of the display panel 110. The first scan signals and the second scan signals may be synchronized.

The first flexible films 122 may be disposed on the lower side of the display panel 110. The first flexible films 122 may be arranged in the first direction (X-axis direction). The second flexible films 124 may be disposed on the upper side of the display panel 110. The second flexible films 124 may be arranged in the first direction (X-axis direction).

One side of each of the first flexible films 122 may be attached to the surface of the first substrate 111 which is exposed without being covered by the second substrate 112. The other side of each of the first flexible films 122 may be attached to a surface of any one of the first source circuit boards 140. Each of the first flexible films 122 may be attached to the surface of the first substrate 111 and the surface of the first source circuit board 140 using an anisotropic conductive film.

One side of each of the second flexible films 124 may be disposed on the surface of the first substrate 111 which is exposed without being covered by the second substrate 112. The other side of each of the second flexible films 124 may be attached to a surface of any one of the second source circuit boards 141. Each of the second flexible films 124 may be attached to the surface of the first substrate 111 and the surface of the second source circuit board 141 using an anisotropic conductive film.

Each of the first flexible films 122 and the second flexible films 124 may be a bendable flexible film such as a tape carrier package or a chip on film. The first flexible films 122 and the second flexible films 124 may be bent to be disposed under the first substrate 111. Therefore, the first source circuit boards 140, the second source circuit boards 141, the first cables 150, the second cables 153, the control circuit board 160, and the timing control circuit 170 may be disposed under the first substrate 111.

Although the first flexible films 122 and the second flexible films 124 are illustrated in FIG. 1, either the first flexible films 122 or the second flexible films 124 can be omitted in the present specification. For example, when the display panel 110 has high resolution such as 8K UHD, the first flexible films 122 and the second flexible films 124 are all needed. However, when the display panel 110 has 4K UHD, either the first flexible films 122 or the second flexible films 124 may be omitted.

In addition, although eight first flexible films 122 and eight second flexible films 124 are attached onto the first substrate 111 of the display panel 110 in FIG. 1, the number of first flexible films 122 and the number of second flexible films 124 are not limited thereto in the present specification. For example, the number of first flexible films 122 and the number of second flexible films 124 may vary according to the number of channels of each of the first flexible films 122 and the number of channels of each of the second flexible films 124. The number of channels of each of the first flexible films 122 indicates the number of lead pads of each of the first flexible films 122 connected to first pads of the display panel 110. The number of channels of each of the second flexible films 124 indicates the number of lead pads of each of the second flexible films 124 connected to second pads of the display panel 110.

The first source driving circuits 121 may be disposed on the first flexible films 122, respectively. The first source driving circuits 121 may be formed as integrated circuits. Each of the first source driving circuits 121 converts digital video data into analog data voltages in response to a first source control signal of the timing control circuit 170 and outputs the analog data voltages to data lines of the display panel 110 through a first flexible film 122.

The second source driving circuits 123 may be disposed on the second flexible films 124, respectively. The second source driving circuits 123 may be formed as integrated circuits. Each of the second source driving circuits 123 converts digital video data into analog data voltages in response to a second source control signal of the timing control circuit 170 and outputs the analog data voltages to the data lines of the display panel 110 through a second flexible film 124.

Each of the first source circuit boards 140 may be connected to the control circuit board 160 through the first cables 150. Each of the first source circuit boards 140 may include first connectors 151*a* connected to the first cables 150.

Each of the second source circuit boards 141 may be connected to the control circuit board 160 through the second cables 153. Each of the second source circuit boards 141 may include third connectors 154 connected to the second cables 153.

The first source circuit boards 140 and the second source circuit boards 141 may be flexible printed circuit boards or printed circuit boards. The first cables 150 and the second cables 153 may be flexible cables.

The control circuit board 160 may be connected to the first source circuit boards 140 through the first cables 150. The control circuit board 160 may include second connectors 152 connected to the first cables 150. The control circuit board 160 may be connected to the second source circuit boards 141 through the second cables 153. The control circuit board 160 may include fourth connectors 155 connected to the second cables 153. The control circuit board 160 may be a flexible printed circuit board or a printed circuit board.

In FIG. 1, four first cables 150 connect the first source circuit boards 140 and the control circuit board 160, and four second cables 153 connect the second source circuit boards 141 and the control circuit board 160. However, the number of first cables 150 and the number of second cables 153 are not limited thereto in the present specification. In addition, in FIG. 1, two first source circuit boards 140 and two second source circuit boards 141 are illustrated. However, the number of first source circuit boards 140 and the number of second source circuit boards 141 are not limited thereto in the present specification.

The timing control circuit 170 may be disposed on the control circuit board 160. The timing control circuit 170 may be formed as an integrated circuit. The timing control circuit 170 may receive digital video data and timing signals from a system-on-chip of a system circuit board. (not shown) The timing control circuit 170 may generate the first source control signal for controlling the timing of the first source driving circuits 121 and the second source control signal for controlling the timing of the second source driving circuits 123 according to the timing signals. The timing control circuit 170 may generate the first scan control signal for controlling the timing of the first scan driver 131 (see FIG. 3) and the second scan control signal for controlling the timing of the second scan driver 132 (see FIG. 3) according to the timing signals.

The system-on-chip may be mounted on the system circuit board connected to the control circuit board 160 through another flexible cable and may be formed as an integrated circuit. The system-on-chip may be a processor of a smart television, a central processing unit (CPU) or graphics card of a computer or notebook computer, or an application processor of a smartphone or tablet PC. The system circuit board may be a flexible printed circuit board or a printed circuit board.

A power supply circuit may be additionally attached onto a surface of the control circuit board 160. The power supply circuit may generate voltages required for driving the display panel 110 using a main power applied from the system circuit board and supply the voltages to the display panel 110. For example, the power supply circuit may generate and supply driving voltages for driving the first scan driver 131 (see FIG. 3), the second scan driver 132 (see FIG. 2), the first source driving circuits 121, the second source driving circuits 123, the timing control circuit 170, etc. The power supply circuit may be formed as an integrated circuit. Alternatively, the power supply circuit may be disposed on a power circuit board formed separately from the control circuit board 160. The power circuit board may be a flexible printed circuit board or a printed circuit board.

Figure 2:
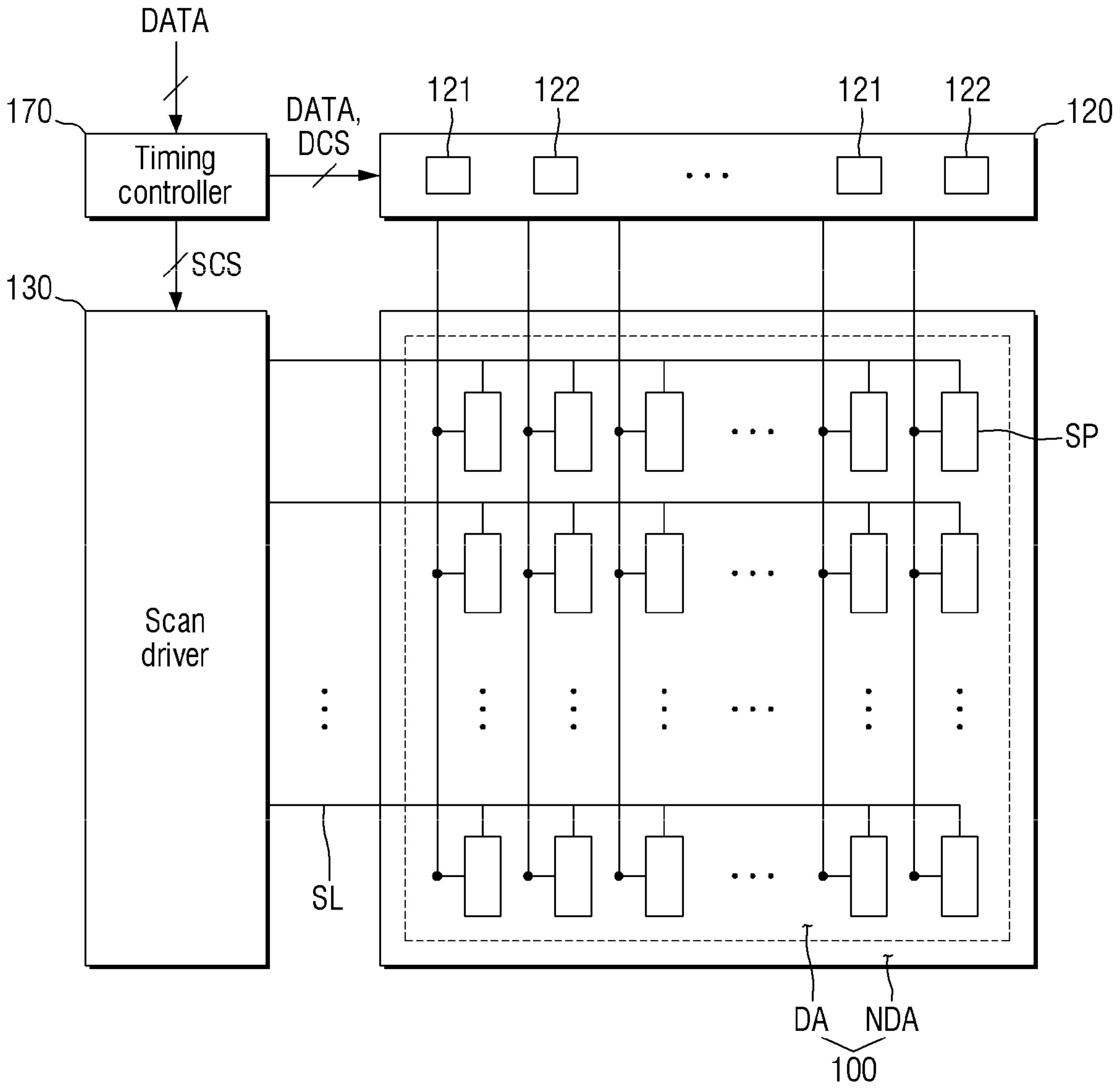
FIG. 2 is a block diagram of a display device according to an embodiment.

FIG. 2 is a block diagram of a display device according to an embodiment.

Referring to FIG. 2, a display panel 100 may include a display area DA which displays an image using subpixels SP and a non-display area NDA which surrounds the display area DA. In the display area DA, not only the subpixels SP but also scan lines SL and data lines DL connected to the subpixels SP may be disposed.

The scan lines SL may extend in the first direction (X-axis direction) and may be disposed in the second direction (Y-axis direction). The data lines DL may extend in the second direction (Y-axis direction) intersecting the first direction (X-axis direction) and may be disposed in the first direction (X-axis direction).

Each of the subpixels SP may be connected to any one of the scan lines SL and any one of the data lines DL. Each of the subpixels SP may include at least one transistor, a storage capacitor, and a pixel electrode. The transistor may be turned on in response to a scan signal received from the scan line SL. Thus, a data voltage of the data line DL may be applied to the pixel electrode. An electric field may be applied to a liquid crystal layer according to a voltage difference between the data voltage applied to the pixel electrode and a common voltage applied to a common electrode. Therefore, liquid crystals of the liquid crystal layers may be driven by the electric field. The storage capacitor serves to maintain the data voltage applied to the pixel electrode for a predetermined period.

The non-display area NDA may be defined as an area extending from the outside of the display area DA to edges of the display panel 100. In the non-display area NDA, a scan driver 130 for transmitting scan signals to the scan lines SL may be disposed.

The scan driver 130 may receive a scan control signal SCS from a timing control circuit 170. The scan driver 130 may generate scan signals according to the scan control signal SCS and sequentially output the scan signals to the scan lines SL. The scan driver 130 may include a first scan driver 131 (see FIG. 3) disposed on a third side of the display panel 100 and a second scan driver 132 (see FIG. 3) disposed on a fourth side of the display panel 100 as illustrated in FIG. 3.

A data driver 120 may include first source driving circuits 121 and second source driving circuits 123. The data driver 120 converts digital video data DATA into analog positive/negative data voltages and outputs the analog positive/negative data voltages to the data lines DL. Therefore, the data voltages may be supplied to the subpixels SP selected by the scan signals of the scan driver 130.

The timing control circuit 170 may receive the digital video data DATA and timing signals from a system-on-chip. The timing control circuit 170 may generate the scan control signal SCS for controlling the operation timing of the scan driver 130 and a data control signal DCS for controlling the operation timing of the data driver 120 according to the timing signals. The timing control circuit 170 may output the scan control signal SCS to the scan driver 130 and the data control signal DCS to the data driver 120.

Figure 3:
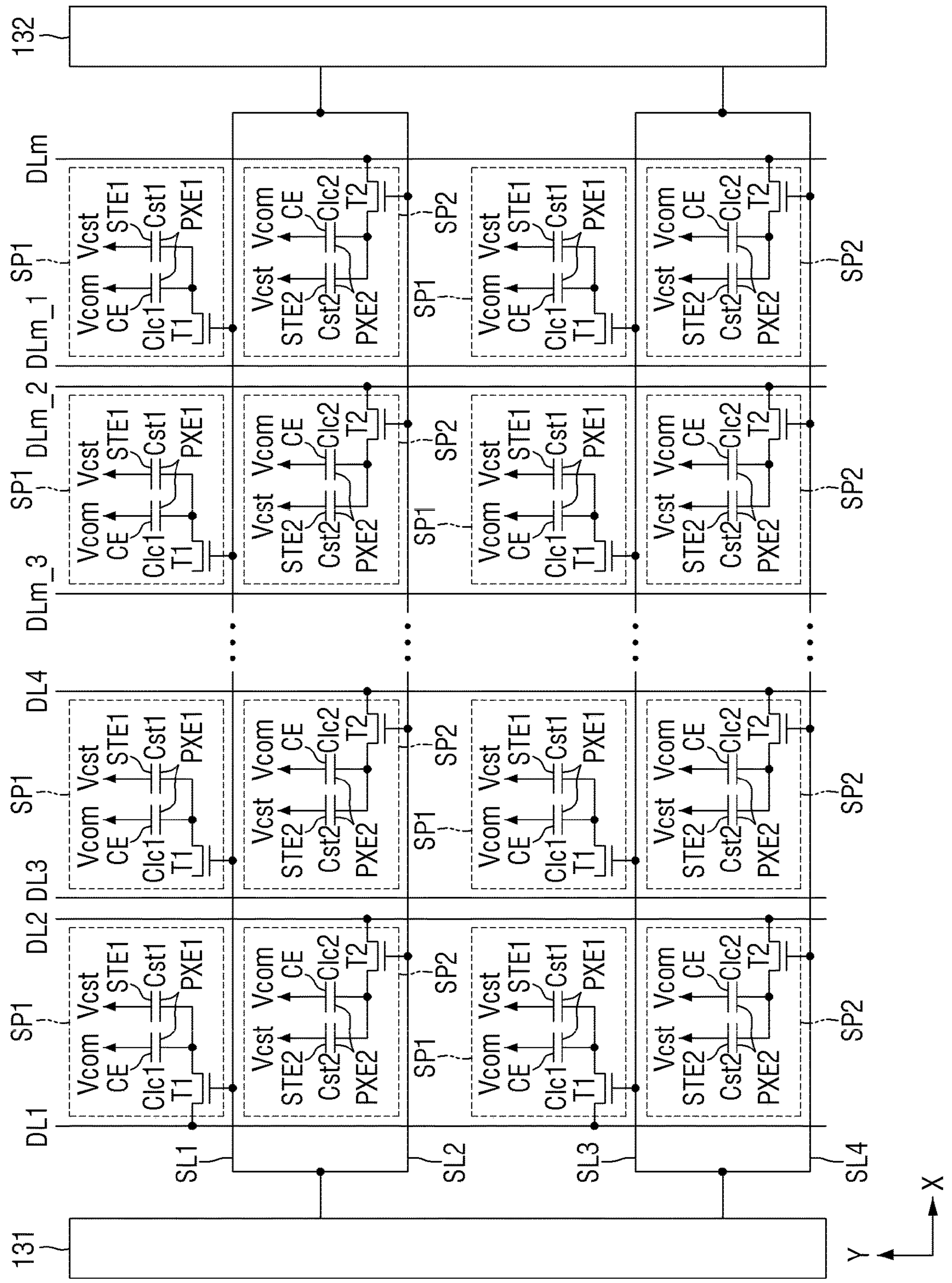
FIG. 3 is a circuit diagram illustrating subpixels of a display panel according to an embodiment.

FIG. 3 is a circuit diagram illustrating subpixels SP1 and SP2 of a display panel 100 according to an embodiment. For ease of description, the subpixels SP1 and SP2 connected to first through fourth scan lines SL1 through SL4, first through fourth data lines DL1 through DL4, and (m-3)th through mth data lines DLm-3 through DLm (where m is a positive integer of 8 or more) are illustrated in FIG. 3.

Referring to FIG. 3, first subpixels SP1 may be connected to odd-numbered scan lines SL1 and SL3, and second subpixels SP2 may be connected to even-numbered scan lines SL2 and SLA. The first subpixels SP connected to any one of the odd-numbered scan lines SL1 and SL3 may be arranged in the first direction (X-axis direction). The second subpixels SP2 connected to any one of the even-numbered scan lines SL2 and SL4 may be arranged in the first direction (X-axis direction). The first subpixels SP1 and the second subpixels SP2 may be alternately arranged in the second direction (Y-axis direction).

Since an odd-numbered scan line and an even-numbered scan line adjacent to each other are connected to each other, the same scan signal may be transmitted to the odd-numbered scan line and the even-numbered scan line adjacent to each other. For example, the first scan line SL1 and the second scan line SL2 adjacent to each other may be connected to each other, and the same scan signal may be transmitted to the first scan line SL1 and the second scan line SL2. The third scan line SL3 and the fourth scan line SLA adjacent to each other may be connected to each other, and the same scan signal may be transmitted to the third scan line SL3 and the fourth scan line SL4.

Of the first subpixels SP1 and the second subpixels SP2 alternately arranged in the second direction (Y-axis direction), the first subpixels SP1 may be connected to an odd-numbered data line, and the second subpixels SP2 may be connected to an even-numbered data line.

A first scan driver 131 may be disposed on a third side of the display panel 100, and a second scan driver 132 may be disposed on a fourth side of the display panel 100. Each of the first scan driver 131 and the second scan driver 132 may be connected to the scan lines SL1 through SL4. The first scan driver 131 and the second scan driver 132 may output synchronized scan signals to respective scan lines SL1 through SL4.

Each of the first scan driver 131 and the second scan driver 132 may include a plurality of transistors to output scan signals in response to a scan control signal SCS. The transistors may be thin-film transistors like a first switching element T1 of each first subpixel SP1 and a second switching element T2 of each second subpixel SP2.

Each of the first subpixels SP1 may include the first switching element T1, a first liquid crystal capacitor Clc1, and a first storage capacitor Cst1.

The first switching element T1 may include a first gate electrode connected to an odd-numbered scan line, a first electrode connected to an odd-numbered data line, and a second electrode connected to a first pixel electrode PXE1. The first switching element T1 may be turned on when a scan signal is transmitted to the odd-numbered scan line and may apply a data voltage of the odd-numbered data line to the first pixel electrode PXE1.

The first switching element T1 may be a thin-film transistor. In this case, any one of the first electrode and the second electrode of the first switching element T1 may be a source electrode, and the other may be a drain electrode.

The first liquid crystal capacitor Cle1 may include the first pixel electrode PXE1 to which a data voltage is applied and a common electrode CE to which a common voltage Vcom is applied. The first liquid crystal capacitor Cle1 may be charged with a voltage difference between the data voltage of the first pixel electrode PXE1 and the common voltage Vcom of the common electrode CE.

The first storage capacitor Cst1 may include the first pixel electrode PXE1 to which a data voltage is applied and a first storage electrode STE1 to which a storage voltage Vest is applied. The first storage capacitor Cst1 may be charged with a voltage difference between the data voltage of the first pixel electrode PXE1 and the storage voltage Vest of the first storage electrode STE1.

Each of the second subpixels SP2 may include the second switching element T2, a second liquid crystal capacitor Clc2, and a second storage capacitor Cst2.

The second switching element T2 may include a second gate electrode connected to an even-numbered scan line, a first electrode connected to an even-numbered data line, and a second electrode connected to a second pixel electrode PXE2. The second switching element T2 may be turned on when a scan signal is transmitted to the even-numbered scan line and may apply a data voltage of the even-numbered data line to the second pixel electrode PXE2.

The second switching element T2 may be a thin-film transistor. In this case, any one of the first electrode and the second electrode of the second switching element T2 may be a source electrode, and the other may be a drain electrode.

The second liquid crystal capacitor Clc2 may include the second pixel electrode PXE2 to which a data voltage is applied and the common electrode CE to which the common voltage Vcom is applied. The second liquid crystal capacitor Clc2 may be charged with a voltage difference between the data voltage of the second pixel electrode PXE2 and the common voltage Vcom of the common electrode CE.

The second storage capacitor Cst2 may include the second pixel electrode PXE2 to which a data voltage is applied and a second storage electrode STE2 to which a storage voltage Vest is applied. The second storage capacitor Cst2 may be charged with a voltage difference between the data voltage of the second pixel electrode PXE2 and the storage voltage Vest of the second storage electrode STE2.

As illustrated in FIG. 3, since an odd-numbered scan line and an even-numbered scan line adjacent to each other are connected to each other, when the same scan signal is transmitted to the odd-numbered scan line and the even-numbered scan line adjacent to each other, the first switching elements T1 of the first subpixels SP1 and the second switching elements T2 of the second subpixels SP2 are turned on simultaneously. Therefore, the first pixel electrodes PXE1 and the second pixel electrodes PXE2 may be simultaneously charged with different data voltages. Hence, when the display panel 100 has high resolution such as 8K UHD, it is possible to prevent a reduction in a charging rate of a data voltage in a pixel electrode. Accordingly, this can prevent a horizontal or vertical line defect from occurring due to a reduction in the charging rate of the data voltage in the pixel electrode.

Figure 4:
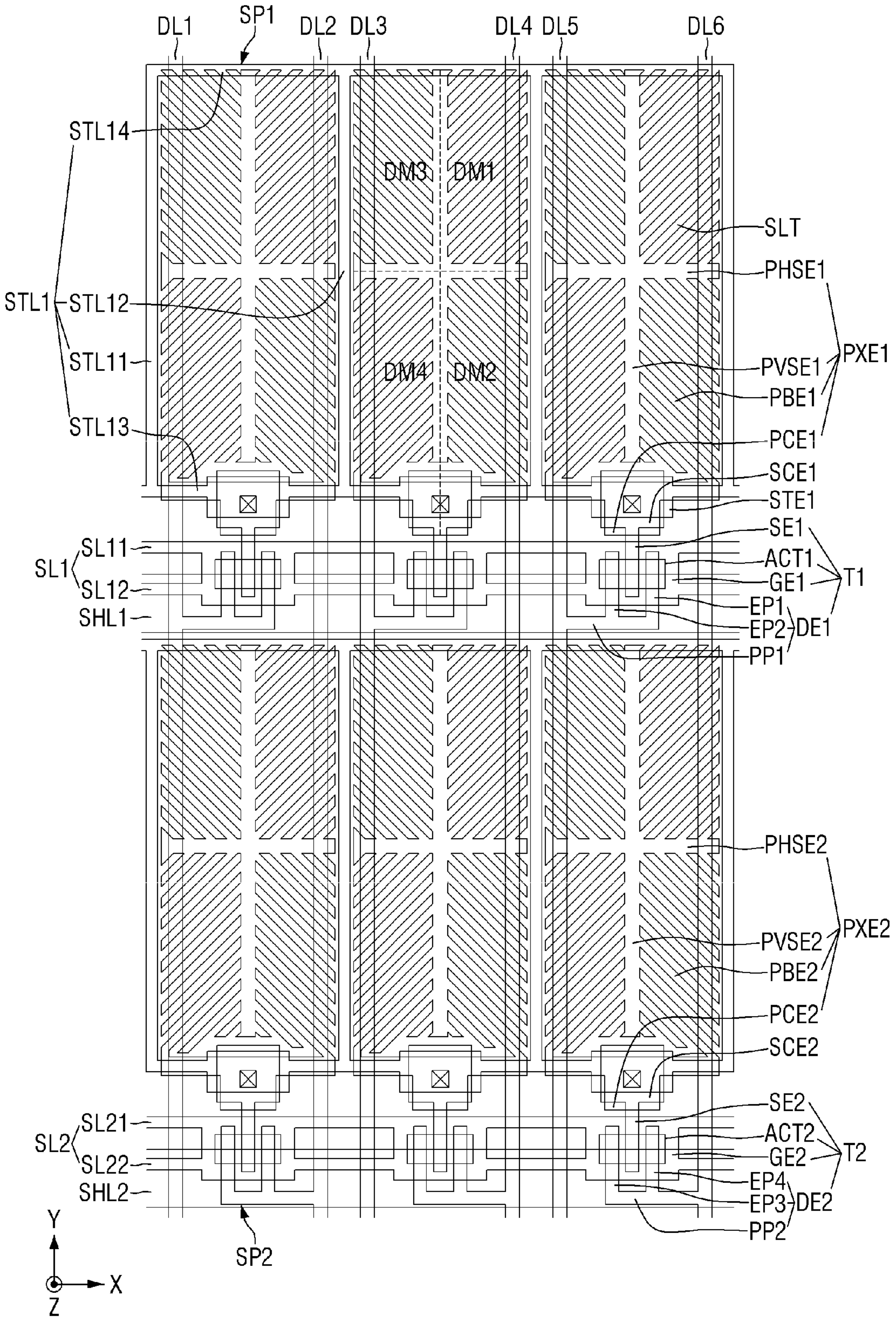
FIG. 4 is a layout view illustrating subpixel of a display panel according to an embodiment.

FIG. 4 is a layout view illustrating subpixels SP1 and SP2 of a display panel according to an embodiment. For ease of description, only the subpixels SP1 and SP2 connected to a first scan line SL1, a second scan line SL2, and first through sixth data lines DL1 through DL6 are illustrated in FIG. 4.

In FIG. 4, a first subpixel SP1 connected to the first scan line SL1 and the first data line DL1 and a second subpixel SP2 connected to the second scan line SL2 and the second data line DL2 will be mainly described for ease of description. In addition, in FIG. 4, a first electrode of a first switching element T1 is a first drain electrode DE1, and a second electrode is a first source electrode SE1.

Referring to FIG. 4, the first subpixel SP1 may include the first switching element T1, a first pixel electrode PXE1, a first source connector SCE1, a first storage electrode STE1, a first storage line STL1, and a first shielding line SHL1.

The first switching element T1 may include a first gate electrode GE1 connected to the first scan line SL1, the first source electrode SE1 connected to the first source connector SCE1, the first drain electrode DE1 connected to the first data line DL1, and a first active layer ACT1 overlapping the first gate electrode GE1.

The first gate electrode GE1 may be a part of the first scan line SL1.

The first active layer ACT1 may overlap not only the first gate electrode GE1 but also the first source electrode SE1 and the first drain electrode DE1. The first active layer ACT1 may have a quadrangular planar shape, but the present disclosure is not limited thereto.

The first source electrode SE1 may protrude from the first source connector SCE1 in the second direction (Y-axis direction). The first source electrode SE1 may extend in the second direction (Y-axis direction) to overlap the first active layer ACT1.

The first drain electrode DE1 may include a first protruding part PP1 protruding from the first data line DL1 in the first direction (X-axis direction), a first extending part EP1 extending from an end of the first protruding part PP1 in the second direction (Y-axis direction), and a second extending part EP2 extending from the middle of the first protruding part PP1 in the second direction (Y-axis direction). The first protruding part PP1, the first extending part EP1, and the second extending part EP2 may form a U shape in a plan view.

Each of the first extending part EP1 and the second extending part EP2 may be spaced apart from the first source electrode SE1 in the first direction (X-axis direction). The first extending part EP1, the first source electrode SE1, and the second extending part EP2 may be disposed in the first direction (X-axis direction). The first source electrode SE1 may be disposed between the first extending part EP1 and the second extending part EP2 in the first direction (X-axis direction). A gap between the first extending part EP1 and the first source electrode SE1 in the first direction (X-axis direction) and a gap between the second extending part EP2 and the first source electrode SE1 may be defined as a channel area of the first switching element T1.

The first source connector SCE1 may extend from the first source electrode SE1 and may be connected to a first pixel electrode connector PCE1 of the first pixel electrode PXE1 through a first contact hole CNT1. The first source connector SCE1 may overlap the first pixel electrode connector PCE1 of the first pixel electrode PXE1. The first source connector SCE1 may have a quadrangular planar shape, but the present disclosure is not limited thereto.

The first source connector SCE1 may overlap the first storage electrode STE1. The first source connector SCE1 and the first storage electrode STE1 overlapping each other may form a first storage capacitor Cst1.

The first pixel electrode PXE1 may include a first horizontal stem PHSE1 extending in the first direction (X-axis direction), a first vertical stem PVSE1 extending in the second direction (Y-axis direction), a plurality of first branches PBE1 extending outward from the first horizontal stem PHSE1 and the first vertical stem PVSE1, and the first pixel electrode connector PCE1 extending from the first vertical stem PVSE1 and/or the first branches PBE1 and overlapping the first source connector SCE1.

The first pixel electrode PXE1 may include four domains DM1 through DM4 defined by the first horizontal stem PHSE1 and the first vertical stem PVSE1. The first horizontal stem PHSE1 and the first vertical stem PVSE1 may be disposed in a cross shape in a plan view.

A slit SLT may be disposed between two adjacent first branches PBE1. That is, the two adjacent first branches PBE1 may be spaced apart by the slit SLT.

The first branches PBE1 may extend in a different direction in each of the four domains DM1 through DM4. For example, the first branches PBE1 disposed in a first domain DM1 located on an upper right side may extend obliquely in an upper right direction. The first branches PBE1 disposed in a second domain DM2 located on a lower right side may extend obliquely in a lower right direction. The first branches PBE1 disposed in a third domain DM3 located on an upper left side may extend obliquely in an upper left direction. The first branches PBE1 disposed in a fourth domain DM4 located on a lower left side may extend obliquely in a lower left direction. Ends of the first branches PBE1 may be connected to each other.

The first shielding line SHL1 may extend in the first direction (X-axis direction). The first shielding line SHL1 may overlap at least a part of the first scan line SL1. The first shielding line SHL1 may overlap at least a part of the first switching element T1. The first shielding line SHL1 may be made of the same material as the first pixel electrode PXE1 and disposed on the same layer as the first pixel electrode PXE1. The first shielding line SHL1 may prevent a parasitic capacitor from being formed between the first scan line SL1 and a common electrode CE and between the first switching element T1 and the common electrode CE and thus causing a liquid crystal driving failure.

The first scan line SL1 may include a first sub-scan line SL11 and a second sub-scan line SL12. Each of the first sub-scan line SL11 and the second sub-scan line SL12 may extend in the first direction (X-axis direction). The first sub-scan line SL11 and the second sub-scan line SL12 may be disposed in the second direction (Y-axis direction). Each of the first sub-scan line SL11 and the second sub-scan line SL12 may be connected to the first gate electrode GE1.

Each of the first sub-scan line SL11 and the second sub-scan line SL12 may intersect the first data line DL1 and the second data line DL2. When particles exist at any one of intersections of the sub-scan lines SL11 and SL12 and the data lines DL1 and DL2 during a process of manufacturing the sub-scan lines SL11 and SL12 and the data lines DL1 and DL2, a sub-scan line and a data line are highly likely to be short-circuited at the any one intersection due to the particles. However, since more than one sub-scan line, for example, two sub-scan lines, intersects data lines, when any one sub-scan line and a data line is short-circuited, a short-circuit failure can be prevented by cutting the any one sub-scan line which is short-circuited.

The first storage line STL1 may include a first sub-storage line STL11 and a second sub-storage line STL12 extending in the second direction (Y-axis direction) and a third sub-storage line STL13 and a fourth sub-storage line STL14 extending in the first direction (X-axis direction). The first storage line STL1 may be made of the same material as the first scan line SL1 and disposed on the same layer as the first scan line SL1.

The first sub-storage line STL11 may be disposed outside the first data line DL1. That is, the first sub-storage line STL11 may be disposed on a left side of the first data line DL1.

The second sub-storage line STL12 may be disposed outside the second data line DL2. That is, the second sub-storage line STL12 may be disposed on a right side of the second data line DL2.

The third sub-storage line STL13 may connect a lower end of the first sub-storage line STL11 and a lower end of the second sub-storage line STL12. The third sub-storage line STL3 may be disposed between the first vertical stem PVSE1 and the first scan line SL1 in the second direction (Y-axis direction). The first storage electrode STE1 may protrude from the third sub-storage line STL13 in the second direction (Y-axis direction).

The fourth sub-storage line STL14 may connect an upper end of the first sub-storage line STL11 and an upper end of the second sub-storage line STL12.

The second subpixel SP2 may include a second switching element T2, a second pixel electrode PXE2, a second source connector SCE2, a second storage electrode STE2, a second storage line STL2, and a second shielding line SHL2.

The second pixel electrode PXE2, the second source connector SCE2, the second storage electrode STE2, the second storage line STL2, and the second shielding line SHL2 of the second subpixel SP2 are substantially identical or similar to the first pixel electrode PXE1, the first source connector SCE1, the first storage electrode STE1, the first storage line STL1, and the first shielding line SHL1 of the first subpixel SP1, and thus a detailed description thereof will be omitted.

In addition, the second switching element T2 of the second subpixel SP2 is the same as the first switching element T1 of the first subpixel SP1 except that a second gate electrode GE2 is connected to the second scan line SL2 instead of the first scan line SL1 and a second drain electrode DE2 is connected to the second data line DL2 instead of the first data line DL1, and thus a detailed description of the second subpixel SP2 will be omitted.

In the first subpixel SP1 and the second subpixel SP2, the first data line DL1 intersects the third sub-storage line STL13 and the fourth sub-storage line STL4 of the first storage line STL1, the first sub-scan line SL11 and the second sub-scan line SL12 of the first scan line SL1, a third sub-storage line STL23 and a fourth sub-storage line STL24 of the second storage line STL2, and a first sub-scan line SL21 and a second sub-scan line SL22 of the second scan line SL2. That is, in the first subpixel SP1 and the second subpixel SP2, the first data line DL1 intersects eight lines.

When particles exist at an intersection of a scan line and a data line, the scan line and the data line are highly likely to be short-circuited at the intersection due to the particles. In addition, when particles exist at an intersection of a storage line and a data line, the storage line and the data line are highly likely to be short-circuited at the intersection due to the particles. Therefore, in order to increase the manufacturing yield of the display panel or reduce cases where the display panel is repaired during a manufacturing process, it is necessary to reduce the number of intersections of the first data line DL1 and the scan lines SL1 and SL2 or the number of intersections of the first data line DL1 and the storage lines STL1 and STL2 in the first subpixel SP1 and the second subpixel SP2.

Figure 5:
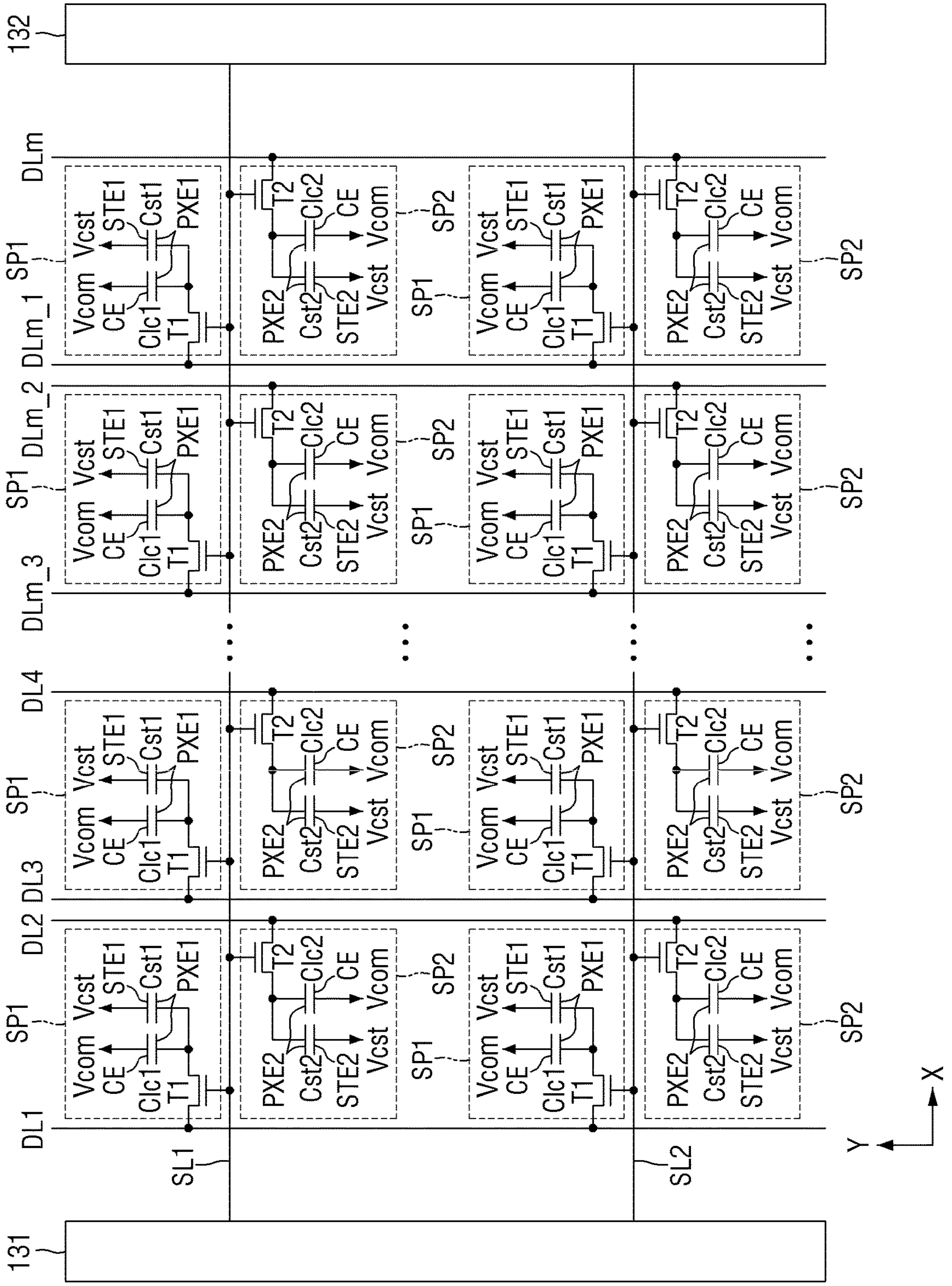
FIG. 5 is a circuit diagram illustrating subpixels of a display panel according to an embodiment.

FIG. 5 is a circuit diagram illustrating subpixels SP1 and SP2 of a display panel 100 according to an embodiment.

For ease of description, the subpixels SP1 and SP2 connected to first and second scan lines SL1 and SL2, first through fourth data lines DL1 through DL4, and (m-3)th through mth data lines DLm-3 through DLm (where m is a positive integer of 8 or more) are illustrated in FIG. 5.

Referring to FIG. 5, a first subpixel SP1 and a second subpixel SP2 disposed adjacent to each other in the second direction (Y-axis direction) may be connected to one scan line. That is, the first subpixel SP1 and the second subpixel SP2 disposed adjacent to each other in the second direction (Y-axis direction) may be connected to the same scan line.

First subpixels SP1 connected to any one scan line may be arranged in the first direction (X-axis direction). Second subpixels SP2 connected to any one scan line may be arranged in the first direction (X-axis direction). The first subpixels SP1 and the second subpixels SP2 may be alternately arranged in the second direction (Y-axis direction).

Of the first subpixels SP1 and the second subpixels SP2 alternately arranged in the second direction (Y-axis direction), the first subpixels SP1 may be connected to an odd-numbered data line, and the second subpixels SP2 may be connected to an even-numbered data line. For example, of the first subpixels SP1 and the second subpixels SP2 alternately arranged in the second direction (Y-axis direction), the first subpixels SP1 may be connected to the first data line DL1, and the second subpixels SP2 may be connected to the second data line DL2.

A first scan driver 131 may be disposed on a third side of the display panel 100, and a second scan driver 132 may be disposed on a fourth side of the display panel 100. Each of the first scan driver 131 and the second scan driver 132 may be connected to the scan lines SL1 and SL2. The first scan driver 131 and the second scan driver 132 may output synchronized scan signals to the scan lines SL1 and SL2.

Each of the first scan driver 131 and the second scan driver 132 may include a plurality of transistors to output scan signals in response to a scan control signal SCS. The transistors may be thin-film transistors like a first switching element T1 of each first subpixel SP1 and a second switching element T2 of each second subpixel SP2.

Each of the first subpixels SP1 may include the first switching element T1, a first liquid crystal capacitor Clc1, and a first storage capacitor Cst1.

The first switching element T1 may include a first gate electrode connected to a scan line, a first electrode connected to an odd-numbered data line, and a second electrode connected to a first pixel electrode PXE1. The first switching element T1 may be turned on when a scan signal is transmitted to the scan line and may apply a data voltage of the odd-numbered data line to the first pixel electrode PXE1.

The first switching element T1 may be a thin-film transistor. In this case, any one of the first electrode and the second electrode of the first switching element T1 may be a source electrode, and the other may be a drain electrode.

The first liquid crystal capacitor Clc1 and the first storage capacitor Cst1 are substantially the same as those described above with reference to FIG. 3, and thus a description thereof will be omitted.

Each of the second subpixels SP2 may include the second switching element T2, a second liquid crystal capacitor Clc2, and a second storage capacitor Cst2.

The second switching element T2 may include a second gate electrode connected to the scan line to which the first gate electrode of the first switching transistor is connected, a first electrode connected to an even-numbered data line, and a second electrode connected to a second pixel electrode PXE2. The second switching element T2 may be turned on when a scan signal is transmitted to the scan line and may apply a data voltage of the even-numbered data line to the second pixel electrode PXE2.

The second switching element T2 may be a thin-film transistor. In this case, any one of the first electrode and the second electrode of the second switching element T2 may be a source electrode, and the other may be a drain electrode.

The second liquid crystal capacitor Clc2 and the second storage capacitor Cst2 are substantially the same as those described above with reference to FIG. 3, and thus a description thereof will be omitted.

As illustrated in FIG. 5, since a first subpixel SP and a second subpixel SP2 adjacent to each other in the second direction (Y-axis direction) are connected to the same scan line, the first switching element T1 of the first subpixel SP1 and the second switching element T2 of the second subpixels SP2 may be turned on simultaneously. Therefore, the first pixel electrode PXE1 and the second pixel electrode PXE2 may be simultaneously charged with different data voltages. Hence, when the display panel 100 has high resolution such as 8K UHD, it is possible to prevent a reduction in a charging rate of a data voltage in a pixel electrode. Accordingly, this can prevent a horizontal or vertical line defect from occurring due to a reduction in the charging rate of the data voltage in the pixel electrode.

Figure 6:
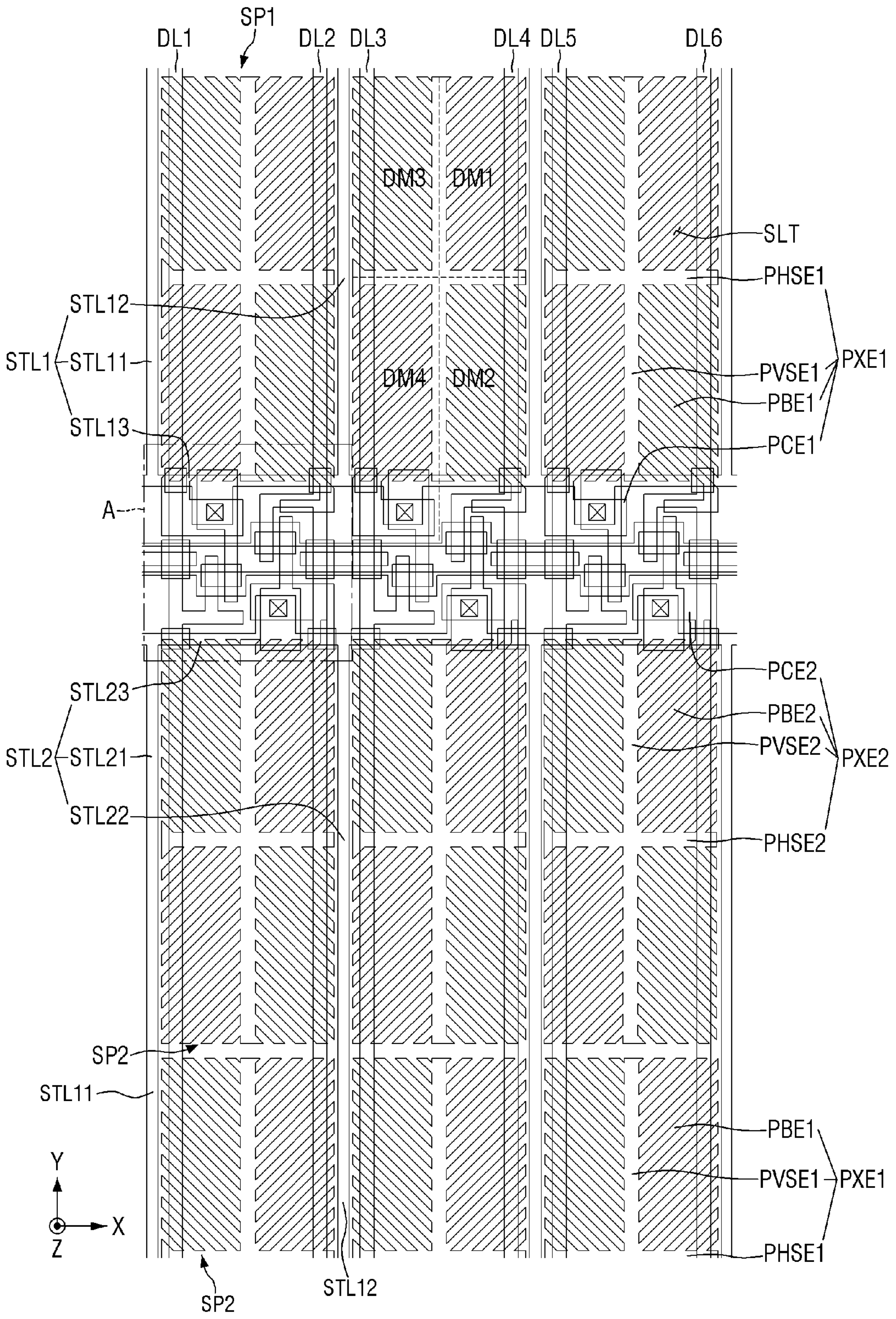
FIG. 6 is a layout view illustrating subpixel of a display panel according to an embodiment.
Figure 7:
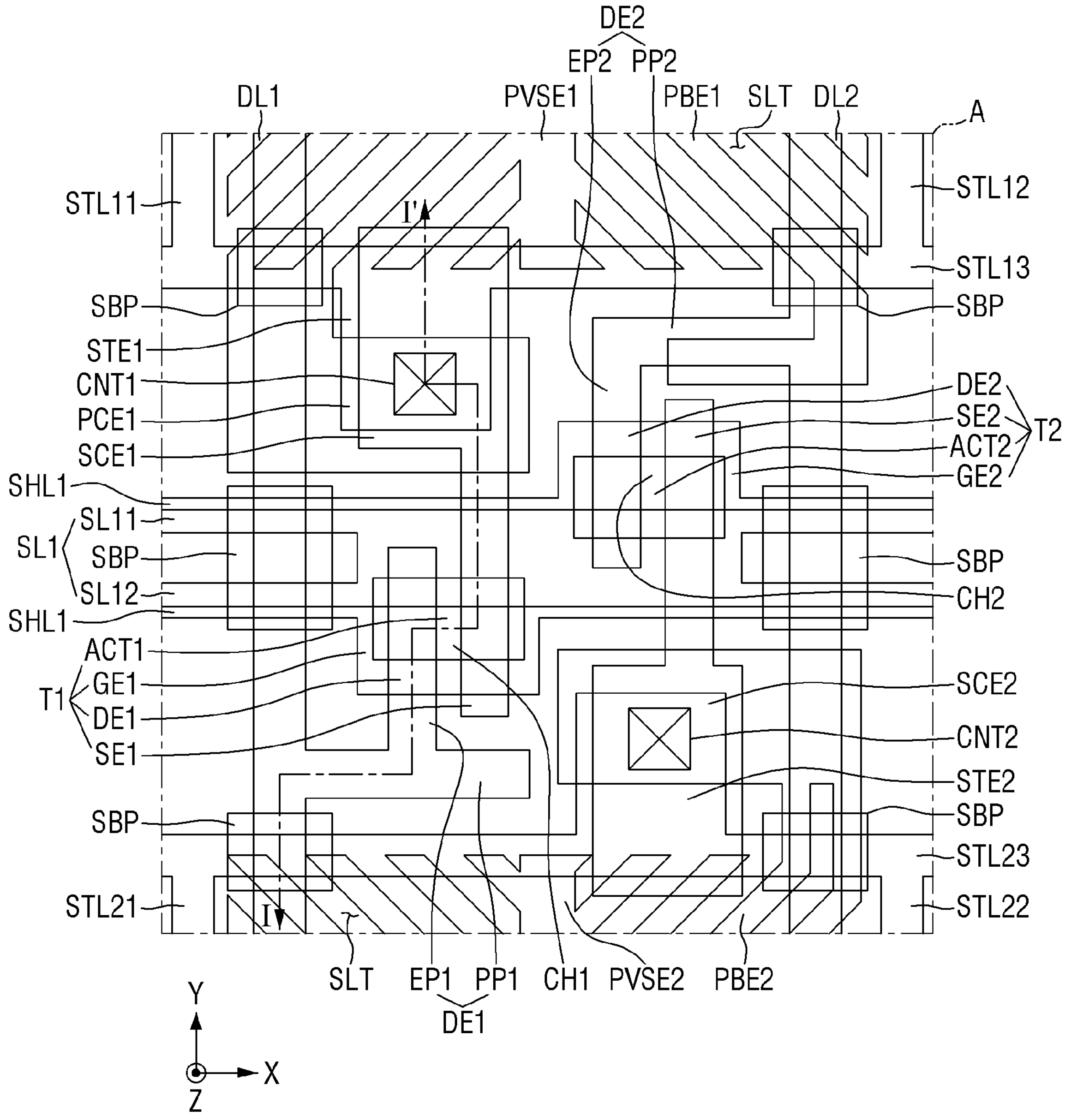
FIG. 7 is an enlarged layout view illustrating an example of a first switching element and a first contact hole of a first subpixel and a second switching element and a second contact hole of a second subpixel of FIG. 6 in detail.

FIG. 6 is a layout view illustrating subpixels SP1 and SP2 of a display panel according to an embodiment. FIG. 7 is an enlarged layout view illustrating an example of a first switching element T1 and a first contact hole CNT1 of a first subpixel SP1 and a second switching element T2 and a second contact hole CNT2 of a second subpixel SP2 of FIG. 6 in detail.

For ease of description, only the subpixels SP1 and SP2 connected to a first scan line SL1, and first through sixth data lines DL1 through DL6 are illustrated in FIG. 6. In FIGS. 6 and 7, a first subpixel SP1 connected to the first scan line SL1 and the first data line DL1 and a second subpixel SP2 connected to the first scan line SL1 and the second data line DL2 will be mainly described for ease of description. In addition, in FIGS. 6 and 7, a first electrode of the first switching element T1 is a first drain electrode DE1, and a second electrode is a first source electrode SE1.

Referring to FIGS. 6 and 7, the first subpixel SP1 may include the first switching element T1, a first pixel electrode PXE1, a first source connector SCE1, a first storage electrode STE1, and a first storage line STL1.

The first switching element T1 may include a first gate electrode GE1 connected to the first scan line SL1, the first source electrode SE1 connected to the first source connector SCE1, the first drain electrode DE1 connected to the first data line DL1, and a first active layer ACT1 overlapping the first gate electrode GE1.

The first gate electrode GE1 may protrude from the first scan line SL1 in the second direction (Y-axis direction). The first gate electrode GE1 may protrude from the first scan line SL1 toward a second pixel electrode PXE2. The first gate electrode GE1 may protrude from the first scan line SL1 to be adjacent to the second pixel electrode PXE2 in the second direction (Y-axis direction).

The first active layer ACT1 may overlap not only the first gate electrode GE1 but also the first source electrode SE1 and the first drain electrode DE1. The first active layer ACT1 may have a quadrangular planar shape, but the present disclosure is not limited thereto.

The first source electrode SE1 may protrude from the first source connector SCE1 in the second direction (Y-axis direction) to overlap the first active layer ACT1. The first source electrode SE1 may protrude from the first source connector SCE1 toward the second pixel electrode PXE2. The first source electrode SE1 may extend in the second direction (Y-axis direction).

The first drain electrode DE1 may include a first protruding part PP1 protruding from the first data line DL1 in the first direction (X-axis direction) and a first extending part EP1 extending from the first protruding part PP1 in the second direction (Y-axis direction). The first extending part EP1 may protrude from the middle of the first protruding part PP1 in the second direction (Y-axis direction) to overlap the first active layer ACT1. The first extending part EP1 may protrude toward the first pixel electrode PXE1. The first protruding part PP1 may extend in the first direction (X-axis direction), and the first extending part EP1 may extend in the second direction (Y-axis direction).

The first extending part EP1 may be spaced apart from the first source electrode SE1 in the first direction (X-axis direction). The first extending part EP1 and the first source electrode SE1 may be disposed in the first direction (X-axis direction). The first source electrode SE1 and the first extending part EP1 may extend in the second direction (Y-axis direction) in an area overlapping the first active layer ACT1. A gap between the first extending part EP1 and the first source electrode SE1 in the first direction (X-axis direction) may be defined as a first channel area CH1 of the first switching element T1.

The first source connector SCE1 may extend from the first source electrode SE1 and may be connected to a first pixel electrode connector PCE1 of the first pixel electrode PXE1 through the first contact hole CNT1. The first source connector SCE1 may overlap the first pixel electrode connector PCE1 of the first pixel electrode PXE1. The first source connector SCE1 may have a quadrangular planar shape, but the present disclosure is not limited thereto.

The first storage electrode STE1 may protrude from a third sub-storage line STL13 of the first storage line STL1 in the second direction (Y-axis direction). The first storage electrode STE1 may protrude toward the second pixel electrode PXE2. The first storage electrode STE1 may overlap the first source connector SCE1. The first storage electrode STE1 and the first source connector SCE1 may form a first storage capacitor Cst1.

The first pixel electrode PXE1 is substantially the same as that described above with reference to FIG. 3, and thus a description thereof will be omitted. The first storage line STL1 is substantially the same as that described above with reference to FIG. 3 except that the first storage line STL1 does not include a fourth sub-storage line STL14, and thus a description thereof will be omitted.

The second subpixel SP2 may include the second switching element T2, the second pixel electrode PXE2, a second source connector SCE2, a second storage electrode STE2, and a second storage line STL2.

The second switching element T2 may include a second gate electrode GE2 connected to the first scan line SL1, a second source electrode SE2 connected to the second source connector SCE2, a second drain electrode DE2 connected to the second data line DL2, and a second active layer ACT2 overlapping the second gate electrode GE2.

The second gate electrode GE2 may protrude from the first scan line SL1 in the second direction (Y-axis direction). The second gate electrode GE2 may protrude from the first scan line SL1 toward the first pixel electrode PXE1. The second gate electrode GE2 may protrude from the first scan line SL1 to be adjacent to the first pixel electrode PXE1 in the second direction (Y-axis direction).

The second active layer ACT2 may overlap not only the second gate electrode GE2 but also the second source electrode SE2 and the second drain electrode DE2. The second active layer ACT2 may have a quadrangular planar shape, but the present disclosure is not limited thereto.

The second source electrode SE2 may protrude from the second source connector SCE2 in the second direction (Y-axis direction) to overlap the second active layer ACT2. The second source electrode SE2 may protrude from the second source connector SCE2 toward the first pixel electrode PXE1. The second source electrode SE2 may extend in the second direction (Y-axis direction) to overlap the second active layer ACT2.

The second drain electrode DE2 may include a second protruding part PP2 protruding from the second data line DL2 in the first direction (X-axis direction) and a second extending part EP2 extending from the second protruding part PP2 in the second direction (Y-axis direction). The second extending part EP2 may protrude from an end of the second protruding part PP2 in the second direction (Y-axis direction). The second extending part EP2 may protrude toward the second pixel electrode PXE2. The second protruding part PP2 may extend in the first direction (X-axis direction), and the second extending part EP2 may extend in the second direction (Y-axis direction).

The second extending part EP2 may be spaced apart from the second source electrode SE2 in the first direction (X-axis direction). The second extending part EP2 and the second source electrode SE2 may be disposed in the first direction (X-axis direction). A gap between the second extending part EP2 and the second source electrode SE2 in the first direction (X-axis direction) may be defined as a second channel area CH2 of the second switching element T2.

The second source connector SCE2 may extend from the second source electrode SE2 and may be connected to a second pixel electrode connector PCE2 of the second pixel electrode PXE2 through the second contact hole CNT2. The second source connector SCE2 may overlap the second pixel electrode connector PCE2 of the second pixel electrode PXE2. The second source connector SCE2 may have a quadrangular planar shape, but the present disclosure is not limited thereto.

The second source connector SCE2 may overlap the second storage electrode STE2. The second source connector SCE2 and the second storage electrode STE2 may form a second storage capacitor Cst2.

The second pixel electrode PXE2 is substantially the same as the first pixel electrode PXE1 of FIG. 4 except that the second pixel electrode connector PCE2 overlaps the second source connector SCE2, and thus a description thereof will be omitted. In addition, the second storage line STL2 is substantially the same as the first storage line STL1 of FIG. 4 except that the second storage line STL2 does not include a fourth sub-storage line STL24, and thus a description thereof will be omitted.

A shielding line SHL may extend in the first direction (X-axis direction). The shielding line SHL may be disposed between the first pixel electrode PXE1 and the second pixel electrode PXE2 in the second direction (Y-axis direction). The shielding line SHL may overlap at least a part of the first scan line SL1. The shielding line SHL may overlap at least a part of the first switching element T1 and at least a part of the second switching element T2. The shielding line SHL may be made of the same material as the first pixel electrode PXE1 and disposed on the same layer as the first pixel electrode PXE1. The shielding line SHL may prevent a parasitic capacitor from being formed between the first scan line SL1 and a common electrode CE, between the first switching element T1 and the common electrode CE and between the second switching element T2 and the common electrode CE and thus causing a liquid crystal driving failure.

The first scan line SL1 may include a first sub-scan line SL11 and a second sub-scan line SL12. Each of the first sub-scan line SL11 and the second sub-scan line SL12 may extend in the first direction (X-axis direction). The first sub-scan line SL11 and the second sub-scan line SL12 may be disposed in the second direction (Y-axis direction). Each of the first sub-scan line SL11 and the second sub-scan line SL12 may be connected to the first gate electrode GE1.

Each of the first sub-scan line SL11 and the second sub-scan line SL12 may intersect the first data line DL1 and the second data line DL2. When particles exist at any one of intersections of the sub-scan lines SL11 and SL12 and the data lines DL1 and DL2 during a process of manufacturing the sub-scan lines SL11 and SL12 and the data lines DL1 and DL2, a sub-scan line and a data line are highly likely to be short-circuited at the any one intersection due to the particles. However, since more than one sub-scan line intersect data lines, when any one sub-scan line and a data line is short-circuited, a short-circuit failure can be prevented by cutting the any one sub-scan line.

In the first subpixel SP1 and the second subpixel SP2, the first data line DL1 intersects the third sub-storage line STL13 of the first storage line STL1, the first sub-scan line SL11 and the second sub-scan line SL12 of the first scan line SL1, and a third sub-storage line STL23 of the second storage line STL2. That is, in the first subpixel SP1 and the second subpixel SP2, the first data line DL1 intersects only four lines. Therefore, since the fourth sub-storage lines STL14 and STL24 can be omitted in the embodiment illustrated in FIG. 6 compared with the embodiment illustrated in FIG. 4, the number of intersections of the first data line DL1 and the storage lines STL1 and STL2 can be reduced. Accordingly, short circuits between the first data line DL1 and the storage lines STL1 and STL2 due to particles can be reduced, thereby increasing the manufacturing yield of the display panel.

In addition, with reference to FIG. 6, a first sub-storage line STL11 of the first storage line STL1 and a first sub-storage line STL21 of the second storage line STL2 may be connected to each other in a space between an upper side of the first pixel electrode PXE1 and a lower side of the second pixel electrode PXE2. A second sub-storage line STL12 of the first storage line STL1 and a second sub-storage line STL22 of the second storage line STL2 may be connected to each other in the space between the upper side of the first pixel electrode PXE1 and the lower side of the second pixel electrode PXE2. Therefore, in a first subpixel SP1 and a second subpixel SP2 which do not share the same scan line and are adjacent to each other in the second direction (Y-axis direction), the first storage line STL1 and the second storage line STL2 may be connected in the first direction (X-axis direction) and the second direction (Y-axis direction) as in a mesh shape.

As illustrated in FIG. 7, the first switching element T1 and the first contact hole CNT1 may be disposed close to each other in the second direction (Y-axis direction), and the second switching element T2 and the second contact hole CNT2 may be disposed close to each other in the second direction (Y-axis direction). For example, the first active layer ACT1 of the first switching element T1 and the first contact hole CNT1 may be disposed close to each other in the second direction (Y-axis direction). The second active layer ACT2 of the second switching element T2 and the second contact hole CNT2 may be disposed close to each other in the second direction (Y-axis direction).

In addition, the first switching element T1 and the second contact hole CNT2 may be disposed close to each other in the first direction (X-axis direction), and the second switching element T2 and the first contact hole CNT1 may be disposed close to each other in the first direction (X-axis direction). For example, at least any one of the first source electrode SE1 and the first drain electrode DE1 of the first switching element T1 and the second contact hole CNT2 may be disposed close to each other in the first direction (X-axis direction). At least any one of the second source electrode SE2 and the second drain electrode DE2 of the second switching element T2 and the first contact hole CNT1 may be disposed close to each other in the first direction (X-axis direction).

Further, the first pixel electrode PXE1 and the second pixel electrode PXE2 may be disposed in the second direction (Y-axis direction).

In this case, when any one of the first switching element T1 and the second switching element T2 is determined to be defective, it can be easily repaired. For example, when the first switching element T1 is defective, the electrical connection between the first source electrode SE1 of the first switching element T1 and the first pixel electrode PXE1 may be cut using a laser, and a pixel connection electrode connecting the first pixel electrode PXE1 and the second pixel electrode PXE2 may be added using an inkjet process. In this case, the inkjet process may be simple because the pixel connection electrode needs to extend only in the second direction (Y-axis direction).

Alternatively, when the second switching element T2 is defective, the electrical connection between the second source electrode SE2 of the second switching element T2 and the second pixel electrode PXE2 may be cut using a laser, and a pixel connection electrode connecting the first pixel electrode PXE1 and the second pixel electrode PXE2 may be added using an inkjet process. In this case, the inkjet process may be simple because the pixel connection electrode needs to extend only in the second direction (Y-axis direction).

Figure 8:
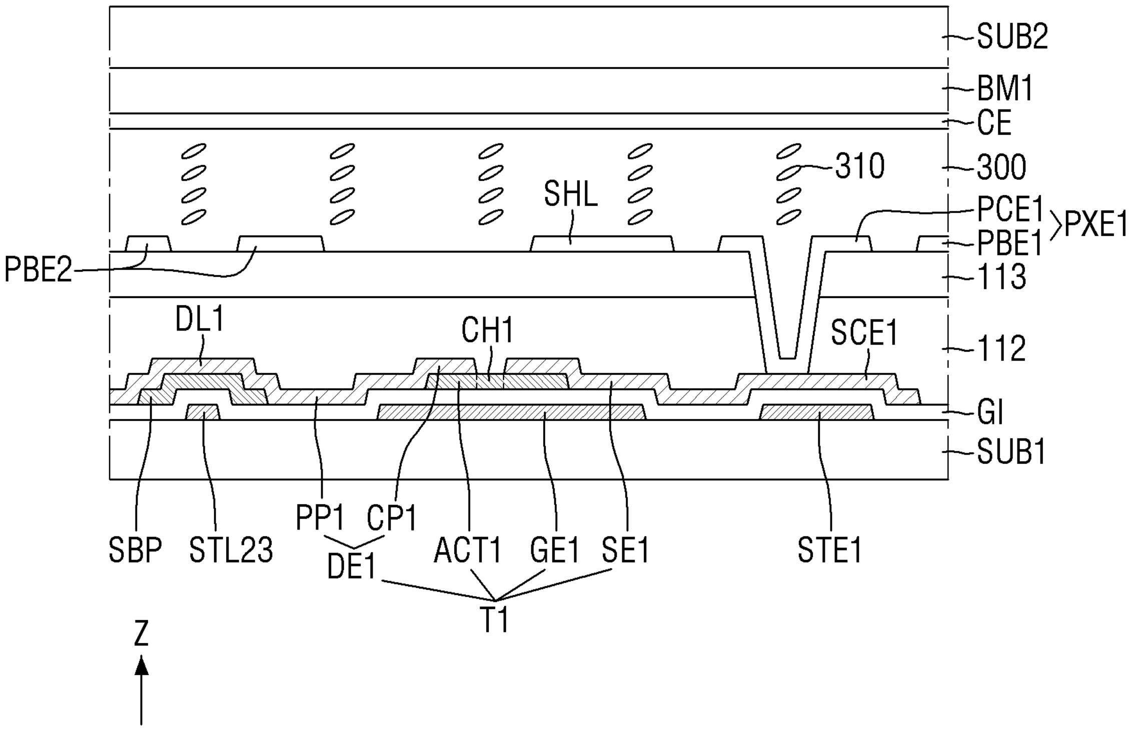
FIG. 8 is a cross-sectional view of an example of the display panel taken along line I-I' of FIG. 7.

FIG. 8 is a cross-sectional view of an example of the display panel taken along line I-I' of FIG. 7. A cross section of a first subpixel SP1 of a display panel 100 will now be described in detail with reference to FIGS. 7 and 8.

Referring to FIGS. 7 and 8, a first switching element T1 and a first pixel electrode PXE1 of the first subpixel SP1 may be disposed on a first substrate SUB1 of the display panel 100, and a common electrode CE may be disposed on a second substrate SUB2. A liquid crystal layer 300 including liquid crystals 310 may be disposed between the first substrate SUB1 and the second substrate SUB2.

The first substrate SUB1 may be a transparent insulating substrate. For example, the first substrate SUB1 may include an insulating material such as glass, quartz, or polymer resin. The polymer material may be polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of the same. The first substrate SUB1 may also have flexibility.

A first conductive layer including a first scan line SL1, a first storage line STL1, a first gate electrode GE1, and a second gate electrode GE2 may be disposed on the first substrate SUB1. That is, the first scan line SL1, the first storage line STL1, the first gate electrode GE1, and the second gate electrode GE2 may be formed at the same time and made of the same material. The first conductive layer may include any one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W) and copper (Cu), or an alloy of the same. Alternatively, the first conductive layer may have two-layer structure of molybdenum/aluminum-neodymium, molybdenum/aluminum, or copper/titanium.

A gate insulating layer GI may be disposed on the first conductive layer. The gate insulating layer GI may include an inorganic insulating material such as a silicon compound or a metal oxide. For example, the gate insulating layer GI may include silicon oxide, silicon nitride, silicon oxynitride, aluminum oxide, tantalum oxide, hafnium oxide, zirconium oxide, titanium oxide, or a combination of the same.

A first active layer ACT1, a second active layer ACT2, and short circuit blocking patterns SBP may be disposed on the gate insulating layer GI. The first active layer ACT1 may include a first channel area CH1 disposed between a first source electrode SE1 and a first drain electrode DE1 in the first direction (X-axis direction). The first channel area CH1 may overlap the first gate electrode GE1. The second active layer ACT2 may include a second channel area CH2 disposed between a second source electrode SE2 and a second drain electrode DE2 in the first direction (X-axis direction). The second channel area CH2 may overlap the second gate electrode GE2.

The first active layer ACT1, the second active layer ACT2, and the short circuit blocking patterns SBP may include a silicon-based semiconductor material such as amorphous silicon, polycrystalline silicon, or monocrystalline silicon. Alternatively, the first active layer ACT1, the second active layer ACT2, and the short circuit blocking patterns SBP may include an oxide semiconductor.

An ohmic contact layer may be disposed on the first active layer ACT1 and the second active layer ACT2. Specifically, the ohmic contact layer may be disposed between the first source electrode SE1 and the first semiconductor layer ACT1, between the first drain electrode DE1 and the first semiconductor layer ACT1, between the second source electrode SE2 and the second semiconductor layer ACT2, and between the second drain electrode DE2 and the second semiconductor layer ACT2. The ohmic contact layer may lower contact resistance by lowering a Schottky barrier between metal and silicon, that is, a work function. The ohmic contact layer may be made of amorphous silicon heavily doped with n-type impurities.

The short circuit blocking patterns SBP may be disposed at intersections of a first data line DL1 and sub-scan lines SL11, SL12, SL21 and SL22 and at intersections of the first data line DL1 and storage lines STL1 and STL2. Specifically, the short circuit blocking patterns SBP may be disposed between the first data line DL1 and a first sub-scan line SL11 of the first scan line SL1, between the first data line DL1 and a second sub-scan line SL12 of the first scan line SL1, between the first data line DL1 and a third sub-storage line STL13 of a first storage line STL1, and between the first data line DL1 and a third sub-storage line STL23 of a second storage line STL2, respectively.

When particles exist at any one of the intersections of the first data line DL1 and the sub-scan lines SL11, SL12, SL21 and SL22, a sub-scan line and the first data line DL1 are highly likely to be short-circuited due to the particles disposed at the any one intersection between the sub-scan line and the first data line DL1. However, when the short circuit blocking patterns SBP are disposed at the intersections of the first data line DL1 and the sub-scan lines SL11, SL12, SL21 and SL22, even if particles exist at any one of the intersections, the short-circuit between a sub-scan line and the first data line DL1 may be prevented by a short circuit blocking pattern SBP. Therefore, the possibility of short=circuit between the sub-scan line and the first data line DL1 can be reduced. In addition, even if particles exist at any one of the intersections between the first data line DL1 and the storage lines STL1 and STL2, a storage line and the first data line DL1 may not directly contact each other due to a short circuit blocking pattern SBP disposed at the any one intersection. Therefore, the possibility of short-circuit between the storage lines STL1 and STL2 and the first data line DL1 can be reduced.

A second conductive layer may be disposed on the gate insulating layer GI, the first semiconductor layer ACT1, the second semiconductor layer ACT2, and the short circuit blocking patterns SBP. The second conductive layer may include the first data line DL1, a second data line DL2, the first source electrode SE1, the first drain electrode DE1, the second source electrode SE2, and the second drain electrode DE2. That is, the first data line DL1, the second data line DL2, the first source electrode SE1, the first drain electrode DE1, the second source electrode SE2, and the second drain electrode DE2 may be formed at the same time and made of the same material. The second conductive layer may include any one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W) and copper (Cu), or an alloy of the same. Alternatively, the second conductive layer may have a two-layer structure of molybdenum/aluminum-neodymium, molybdenum/aluminum or copper/titanium or a three-layer structure of molybdenum/titanium/molybdenum or molybdenum/aluminum/molybdenum.

The first source electrode SE1 and the first drain electrode DE1 may be disposed on the first semiconductor layer ACT1. The second source electrode SE2 and the second drain electrode DE2 may be disposed on the second semiconductor layer ACT2.

A color filter 112 may be disposed on the first switching element T1 and a second switching element T2. The color filter 112 may be a red color filter, a green color filter, or a blue color filter. The red color filter may be disposed in a first subpixel SP1 connected to the first data line DL1 and a second subpixel SP2 connected to the second data line DL2 in FIG. 6. In addition, the green color filter may be disposed in a first subpixel SP1 connected to the third data line DL3 and a second subpixel SP2 connected to the fourth data line DL4 in FIG. 6. In addition, the blue color filter may be disposed in a first subpixel SP1 connected to the fifth data line DL5 and a second subpixel SP2 connected to the sixth data line DL6 in FIG. 6.

An insulating layer 113 may be disposed on the color filter 212. The insulating layer 113 may include an organic insulating material or an inorganic insulating material. For example, the insulating layer 113 may be an overcoat layer made of an organic insulating material.

A third conductive layer including the first pixel electrode PXE1, a second pixel electrode PXE2, and a shielding line SHL may be disposed on the insulating layer 113. That is, the first pixel electrode PXE1, the second pixel electrode PXE2, and the shielding line SHL may be formed at the same time and made of the same material. A first pixel electrode connector PCE1 of the first pixel electrode PXE1 may be connected to the first source electrode SE1 through a first contact hole CNT1 formed through the color filter 112 and the insulating layer 113.

The third conductive layer may be made of a transparent material through which light can be transmitted. For example, the third conductive layer may be made of indium tin oxide (ITO), indium zinc oxide (IZO), or indium tin zinc oxide (ITZO). However, the present disclosure is not limited thereto, and any material that is transparent and conductive can be used.

The second substrate SUB2 facing the first substrate SUB1 may be a transparent insulating substrate, like the first substrate SUB1. The second substrate SUB2 may also have flexibility.

A first light blocking member BM1 may be disposed on a surface of the second substrate SUB2 which faces the first substrate SUB1. The first light blocking member BM1 may overlap the first switching element T1, the first contact hole CNT1, the second switching element T2, and a second contact hole CNT2. The first light blocking member BM1 may include a light blocking pigment such as carbon black or an opaque metal material such as chromium (Cr). Alternatively, the first light blocking member BM1 may include a photosensitive organic material. The first light blocking member BM1 may also be disposed on the first substrate SUB1.

The common electrode CE may be disposed on a surface of the first light blocking member BM1 which faces the first substrate SUB1. The common electrode CE may be made of a transparent conductive material such as indium tin oxide (ITO), indium zinc oxide (IZO), or indium tin zinc oxide (ITZO). The common electrode CE may be formed over the entire surface of the second substrate SUB2.

The liquid crystal layer 300 may be disposed between the first substrate SUB1 and the second substrate SUB2. The liquid crystal layer 300 may include the liquid crystals 310 having dielectric anisotropy. When a data voltage is applied to the first pixel electrode PXE1 and a common voltage is applied to the common electrode CE, an electric field may be formed between the first pixel electrode PXE1 and the common electrode CE. The arrangement of the liquid crystals 310 of the liquid crystal layer 300 may be changed according to the applied electric field between the first pixel electrode PXE1 and the common electrode CE, thereby controlling the transmittance of light passing through the first subpixel SP1.

Specifically, when an electric field is formed between the first pixel electrode PXE1 and the common electrode CE, the liquid crystals 310 may rotate in a specific direction, thereby adjusting a phase delay value of light passing through the liquid crystal layer 300. How much the phase delay value is changed by the rotation of the liquid crystals 310 may determine the amount of light passing through an upper polarizing film disposed on an upper surface of the second substrate SUB2 after passing through a lower polarizing film disposed on a lower surface of the first substrate SUB1. Therefore, the transmittance of light passing through the first subpixel SP1 may be controlled.

The cross-sectional structure of a second subpixel SP2 may be substantially the same as the cross-sectional structure of the first subpixel SP1 described above with reference to FIG. 8, and thus a description thereof will be omitted.

Figure 9:
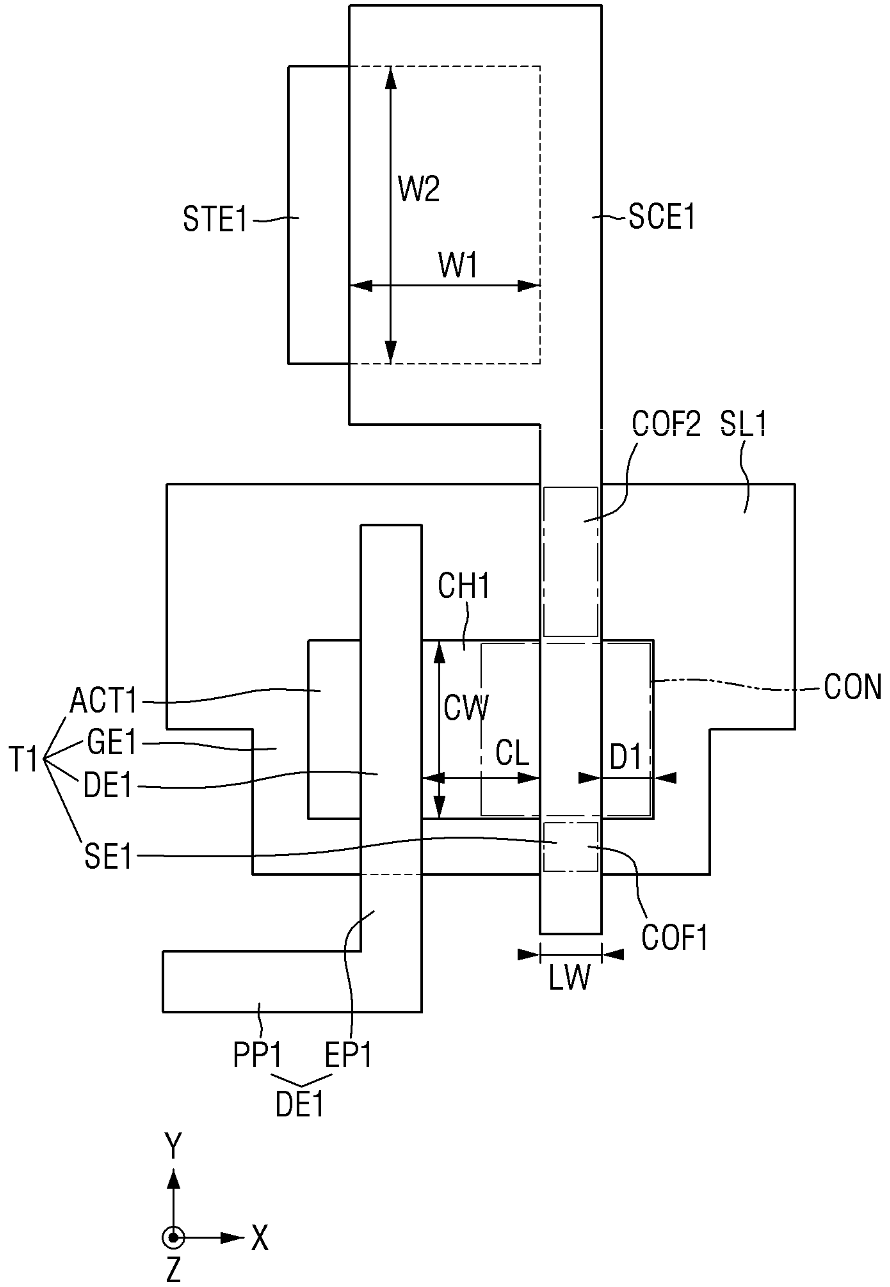
FIGS. 9, 10 and 11 are enlarged layout views illustrating the first switching element, a first source connector and a first storage electrode of the first subpixel of FIG. 8 in detail.
Figure 10:
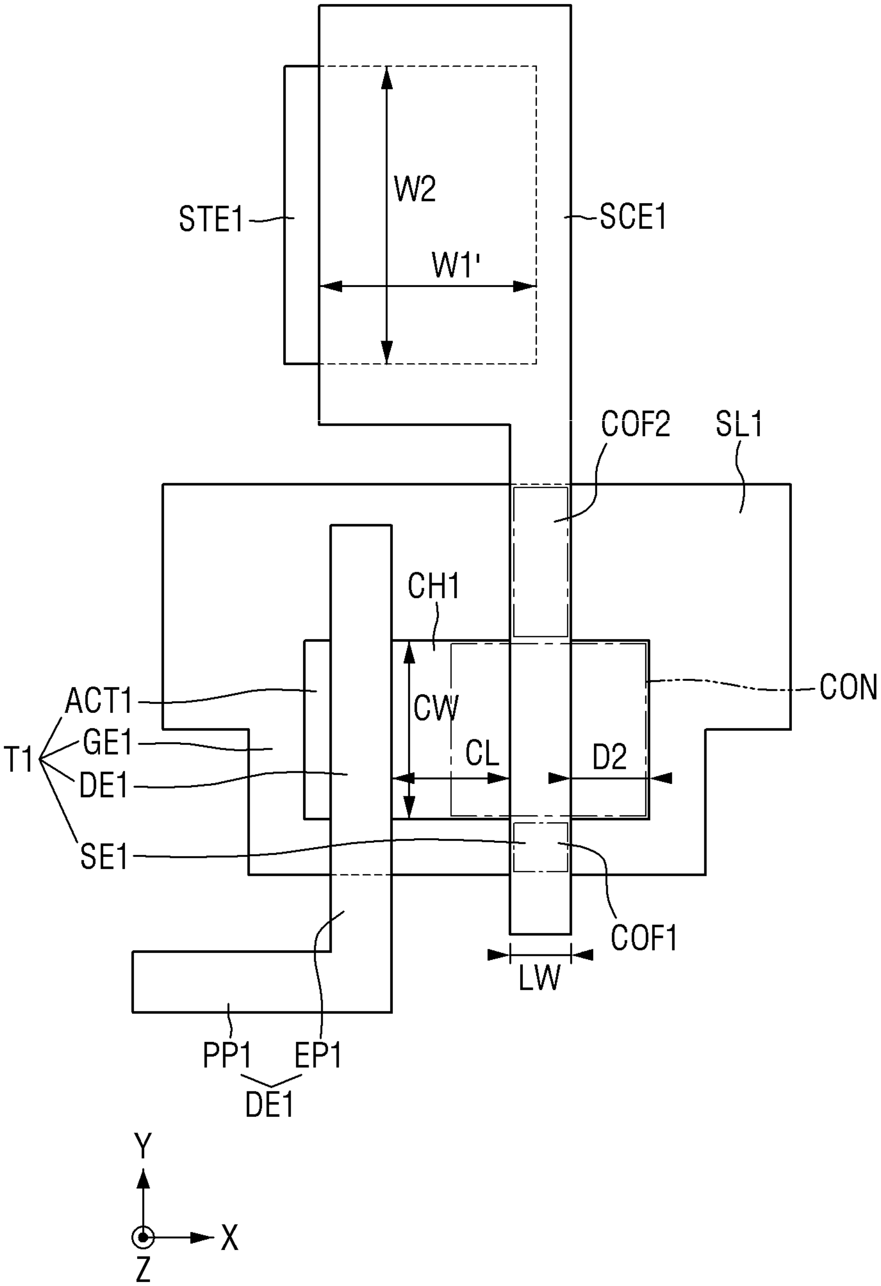
Figure 11:
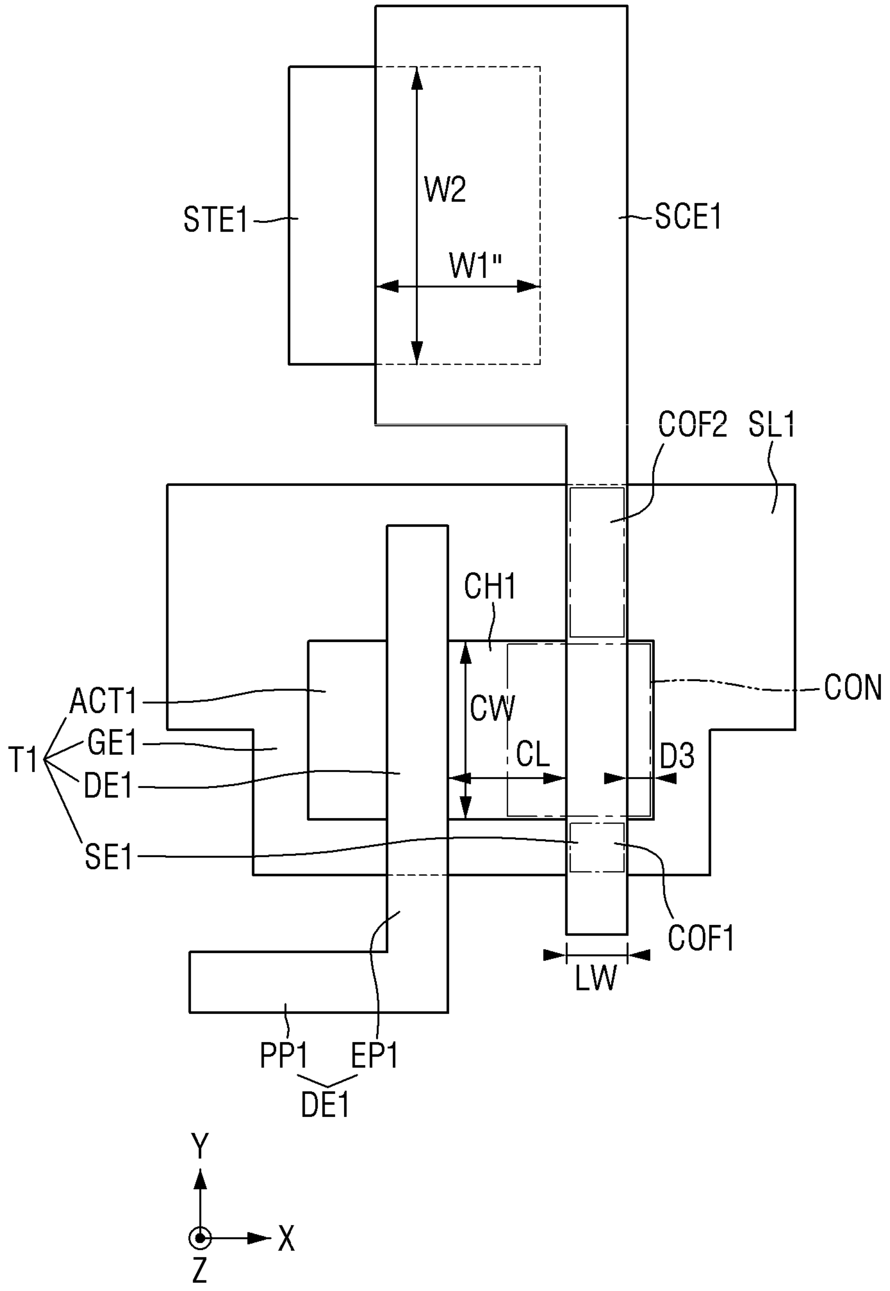

FIGS. 9 through 11 are enlarged layout views illustrating the first switching element T1, a first source connector SCE1 and a first storage electrode STE1 of the first subpixel SP1 of FIG. 8 in detail.

In FIG. 9, the first source electrode SE1, the first drain electrode DE1, and the first source connector SCE1 are accurately aligned. In FIG. 10, the first source electrode SE1, the first drain electrode DE1, and the first source connector SCE1 are shifted to the left. In FIG. 11, the first source electrode SE1, the first drain electrode DE1, and the first source connector SCE1 are shifted to the right.

Referring to FIGS. 9 through 11, the first source electrode SE1 may extend in the second direction (Y-axis direction) in an area overlapping the first active layer ACT1. The first drain electrode DE1 may extend in the second direction (Y-axis direction) in an area overlapping the first active layer ACT1. The first source electrode SE1 and the first drain electrode DE1 on the first active layer ACT1 may be spaced apart from each other in the first direction (X-axis direction). The first active layer ACT1 between the first source electrode SE1 and the first drain electrode DE1 in the first direction (X-axis direction) may be defined as the first channel area CH1.

A length of the first active layer ACT1 in the second direction (Y-axis direction) may be defined as a channel width CW of the first channel area CH1. A length between the first source electrode SE1 and the first drain electrode DE1 in the first direction (X-axis direction) may be defined as a channel length CL.

Since the first source electrode SE1 overlaps the first scan line SL1, parasitic capacitance may be formed between the first source electrode SE1 and the first scan line SL1. Due to the parasitic capacitance, the first source electrode SE1 may be affected by a voltage change of the first scan line SL1. For example, when a scan signal of the first scan line SL1 is changed from a gate-on voltage to a gate-off voltage, a voltage of the first source electrode SE1 may be changed by a kickback voltage ΔVp. The kickback voltage ΔVp may be defined as in Equation (1).

$$\Delta Vp = \frac{Cgs}{CAlc1 + CAst1 + Cgs} \times (\text{V on} - \text{V off}). \quad (1)$$

In Equation (1), ΔVp may be a kickback voltage, Cgs may be parasitic capacitance between the first gate electrode GE1 and the first source electrode SE1, CAlc1 may be capacitance of a first liquid crystal capacitor Clc1, CAst1 may be capacitance of a first storage capacitor Cst1, Von may be a gate-on voltage level of a scan signal transmitted to the first scan line SL1, and Voff may be a gate-off voltage level of the scan signal transmitted to the first scan line SL1.

An area where parasitic capacitance is formed between the first source electrode SE1 and the first scan line SL1 may include a first on-overlap area CON, a first off-overlap area COF1, and a second off-overlap area COF2.

The first on-overlap region CON refers to an area of parasitic capacitance formed between the first active layer ACT1 and the first scan line SL1 when the first channel area CH1 of a first transistor is activated by a gate-on voltage applied to the first scan line SL1. The first on-overlap region CON may include an overlap area between the first source electrode SE1 and the first active layer ACT1, an area extending from a first side of the first source electrode SE1 facing the first drain electrode DE1 up to half of the channel length CL of the first channel area CH1, and an area extending from a second side opposite the first side of the first source electrode SE1 to an end of the first active layer ACT1.

The first off-overlap area COF1 and the second off-overlap area COF2 refer to areas of parasitic capacitance formed between the first active layer ACT1 and the first scan line SL1 when the first channel area CH1 of the first transistor is activated and deactivated. The first off-overlap area COF1 is an area where the first source electrode SE1 and the first scan line SL1 face each other and may be defined as an area disposed outside a lower side of the first active layer ACT1. The second off-overlap area COF2 is an area where the first source electrode SE1 and the first scan line SL1 face each other and may be defined as an area disposed outside an upper side of the first active layer ACT1.

When the first source electrode SE1, the first drain electrode DE1, and the first source connector SCE1 are shifted to the left as illustrated in FIG. 10 due to a misalignment during the manufacturing of the display panel 100, the first on-overlap area CON may increase. In particular, a distance D2 from the second side opposite the first side of the first source electrode SE1 to the end of the first active layer ACT1 may increase as illustrated in FIG. 10 compared with a distance D1 illustrated in FIG. 9. Therefore, the parasitic capacitance formed between the first source electrode SE1 and the first scan line SL1 may increase due to increase in the first on-overlap area CON. On the other hand, since a lower end of the first source electrode SE1 protrudes further than a lower end of the first gate electrode GE1, the first off-overlap area COF1 may be maintained as it is. The second off-overlap area COF2 may also be maintained as it is.

In addition, when the first source electrode SE1, the first drain electrode DE1, and the first source connector SCE1 are shifted to the right as illustrated in FIG. 11 due to a misalignment during the manufacturing of the display panel 100, the first on-overlap area CON may decrease. In particular, a distance D3 from the second side opposite the first side of the first source electrode SE1 to the end of the first active layer ACT1 may decrease as illustrated in FIG. 11 compared with the distance D1 illustrated in FIG. 9. Therefore, the parasitic capacitance formed between the source electrode SE1 and the first scan line SL1 may decrease. On the other hand, since the lower end of the first source electrode SE1 protrudes further than the lower end of the first gate electrode GE1, the first off-overlap area COF1 may be maintained as it is. The second off-overlap area COF2 may also be maintained as it is.

As illustrated in FIGS. 9 through 11, when the first source electrode SE1, the first drain electrode DE1, and the first source connector SCE1 are shifted to the left or the right due to a misalignment during the manufacturing of the display panel 100, the first on-overlap area CON changes, thereby changing the parasitic capacitance formed between the source electrode SE1 and the first scan line SL1. Therefore, the kickback voltage ΔVp affecting the voltage of the first source electrode SE1 may change. Referring to Equation (1), when the first source electrode SE1, the first drain electrode DE1, and the first source connector SCE1 are shifted to the left, the parasitic capacitance between the first gate electrode GE1 and the first source electrode SE1 increases, thereby increasing the kickback voltage ΔVp. In addition, when the first source electrode SE1, the first drain electrode DE1, and the first source connector SCE1 are shifted to the right, the parasitic capacitance between the first gate electrode GE1 and the first source electrode SE1 decreases, thereby decreasing the kickback voltage ΔVp.

Here, a left end of the first storage electrode STE1 may protrude further than a left end of the first source connector SCE1 in the first direction (X-axis direction), and a right end of the first source connector SCE1 may protrude further than a right end of the first storage electrode STE1 in the first direction (X-axis direction). Therefore, when the first source electrode SE1, the first drain electrode DE1, and the first source connector SCE1 are shifted to the left as in FIG. 10, an overlap area between the first storage electrode STE1 and the first source connector SCE1 may increase. A length W1' of the overlap area between the first storage electrode STE1 and the first source connector SCE1 in the first direction (X-axis direction) in FIG. 10 may be greater than a length W1 illustrated in FIG. 9. As illustrated in FIGS. 9 and 10, a length W2 of the overlap area between the first storage electrode STE1 and the first source connector SCE1 in the second direction (Y-axis direction) may remain substantially unchanged.

Accordingly, the capacitance of the first storage capacitor Cst1 may increase. That is, when the first source electrode SE1, the first drain electrode DE1, and the first source connector SCE1 are shifted to the left as illustrated in FIG. 10, the capacitance of the first storage capacitor Cst1 may increase due to an increase in the overlapping area between the first storage capacitor Cst1 and first source connector SCE1. Referring to Equation (1), when the capacitance of the first storage capacitor Cst1 increases, the kickback voltage ΔVp affecting the voltage of the first source electrode SE1 may decrease. Therefore, even if the first source electrode SE1, the first drain electrode DE1, and the first source connector SCE1 are shifted to the left as illustrated in FIG. 10, a change in the kickback voltage ΔVp may be insignificant.

In addition, when the first source electrode SE1, the first drain electrode DE1, and the first source connector SCE1 are shifted to the right as illustrated in FIG. 11, the overlap area between the first storage electrode STE1 and the first source connector SCE1 may decrease. In particular, a length W1" of the overlap area between the first storage electrode STE1 and the first source connector SCE1 in the first direction (X-axis direction) in FIG. 11 may be smaller than the length W1 illustrated in FIG. 9. As illustrated in FIGS. 9 and 10, the length W2 of the overlap area between the first storage electrode STE1 and the first source connector SCE1 in the second direction (Y-axis direction) may remain substantially unchanged.

Accordingly, the capacitance of the first storage capacitor Cst1 may decrease. That is, when the first source electrode SE1, the first drain electrode DE1, and the first source connector SCE1 are shifted to the right as illustrated in FIG. 11, the capacitance of the first storage capacitor Cst1 may decrease by a decrease in the overlapping area between the first storage capacitor Cst1 and first source connector SCE1. Therefore, even if the first source electrode SE1, the first drain electrode DE1, and the first source connector SCE1 are shifted to the right as illustrated in FIG. 11, a change in the kickback voltage ΔVp may be insignificant.

Since the magnitude of the parasitic capacitance Cgs is not large, the length W2 of the overlap area between the first storage electrode STE1 and the first source connector SCE1 in the second direction (Y-axis direction) may be greater than the length W1, W1' or W1" in the first direction (X-axis direction) regardless of the shifting of the first source electrode SE1, the first drain electrode DE1 and the first source connector SCE1 in order to prevent the capacitance of the first storage capacitor Cst from being changed too much by the shifting of the first source electrode SE1, the first drain electrode DE1 and the first source connector SCE1.

As illustrated in FIGS. 9 through 11, even if the parasitic capacitance Cgs is changed by the shifting of the first source electrode SE1, the first drain electrode DE1 and the first source connector SCE1 due to a misalignment during the manufacturing process, a change in the kickback voltage ΔVp affecting the first source electrode SE1 can be prevented by changing the capacitance of the first storage capacitor Cst1.

When the area of the first channel area CH1 is reduced, the parasitic capacitance Cgs formed between the first source electrode SE1 and the first scan line SL1 may be reduced. For example, the channel length CL of the first channel area CH1 may be 4.3 μm or less, and the channel width CW may be 10 μm or less. When the channel length CL of the first channel area CH1 is less than 2.5 μm or when the channel width CW is less than 5 μm, process difficulty may increase, thereby increasing process dispersion. Thus, the uniformity of the channel length CL and the channel width CW of the first channel area CH1 may be reduced. Therefore, the channel length CL of the first channel area CH1 may be 2.5 to 4.3 μm, and the channel width CW may be 5 to 10 μm.

In addition, as a line width LW of the first source electrode SE1 increases, the first on-overlap area CON formed between the first source electrode SE1 and the first scan line SL1 decreases, thereby reducing the parasitic capacitance Cgs. For example, the line width LW of the first source electrode SE1 may be about 3.5 μm or more. However, when the line width LW of the first source electrode SE1 is 7 μm or more, the first off-overlap area COF1 and the second off-overlap area COF2 of the parasitic capacitance Cgs may increase, thereby increasing the parasitic capacitance Cgs. Therefore, the line width LW of the first source electrode SE1 may be 3.5 to 7 μm.

A second storage electrode STE2, a second source connector SCE2, a channel length of the second channel area CH2, a channel width of the second channel area CH2, and a line width of the second source electrode SE2 are substantially the same as the first storage electrode STE1, the first source connector SCE1, the channel length CL of the first channel area CH1, the channel width CW of the first channel area CH1, and the line width LW of the first source electrode SE1 described above with reference to FIGS. 9 through 11, and thus a description thereof will be omitted.

Figure 12:
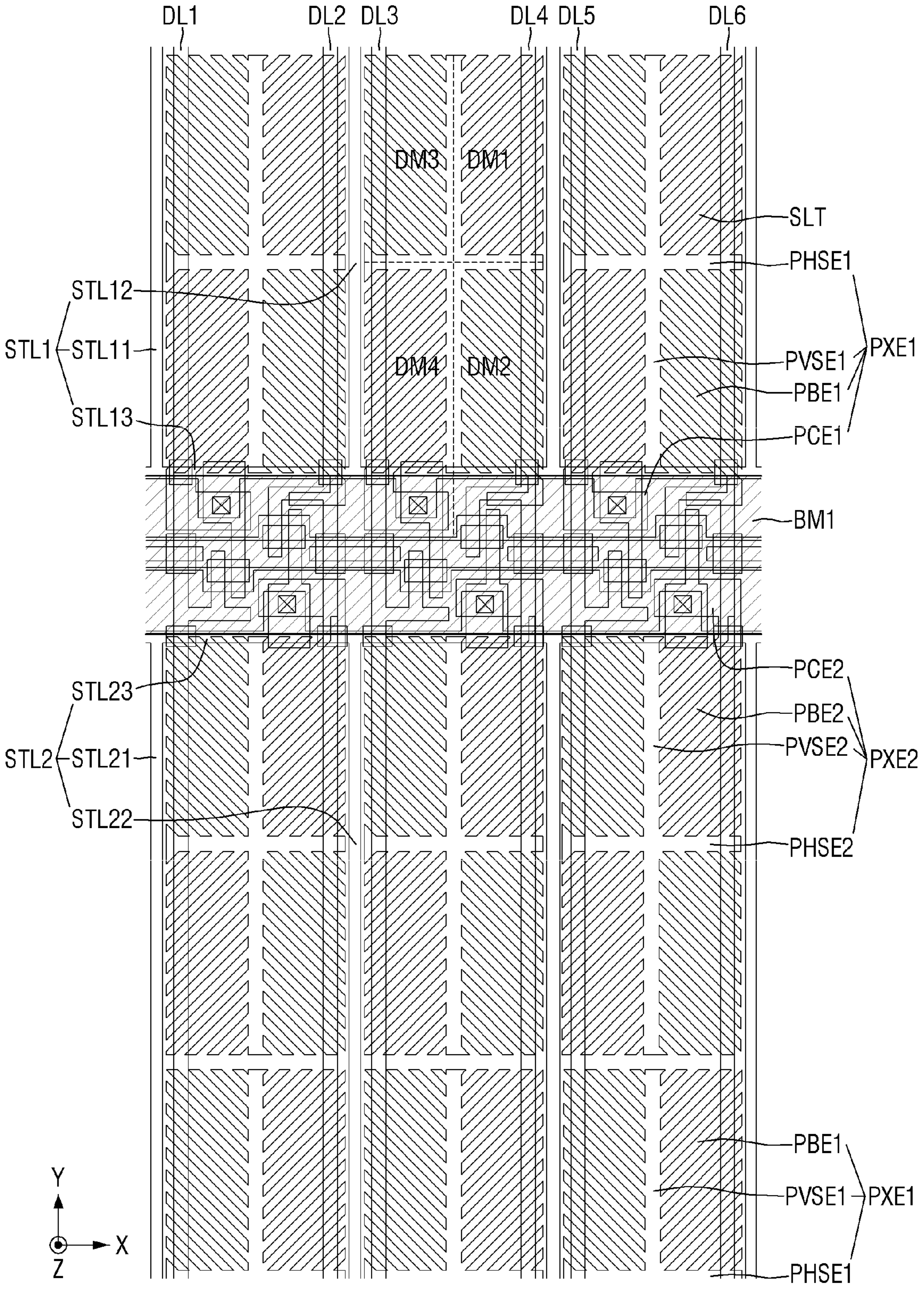
FIG. 12 is a layout view illustrating an example of the subpixels and a light blocking member of the display panel illustrated in FIG. 6.

FIG. 12 is a layout view illustrating an example of the subpixels SP1 and SP2 and a light blocking member of the display panel illustrated in FIG. 6.

Referring to FIG. 12, a first light blocking member BM1 may overlap a first switching element T1, a first source connector SCE1, a first pixel electrode connector PCE1, and a first contact hole CNT1 of a first subpixel SP1. A first horizontal stem PHSE1, a first vertical stem PVSE1, and a plurality of first branches PBE1 disposed in four domains DM1 through DM4 of a first pixel electrode PXE1 may be exposed without being covered by the first light blocking member BM1. Therefore, the arrangement of liquid crystals 310 of a liquid crystal layer 300 disposed between the first pixel electrode PXE1 and a common electrode CE may be changed by an electric field between the first pixel electrode PXE1 and the common electrode CE.

In addition, the first light blocking member BM1 may overlap a second switching element T2, a second source connector SCE2, a second pixel electrode connector PCE2, and a second contact hole CNT2 of a second subpixel SP2. A second horizontal stem PHSE2, a second vertical stem PVSE2, and a plurality of second branches PBE2 disposed in four domains DM1 through DM4 of a second pixel electrode PXE2 may be exposed without being covered by the first light blocking member BM1. Therefore, the arrangement of the liquid crystals 310 of the liquid crystal layer 300 disposed between the second pixel electrode PXE2 and the common electrode CE may be changed by an electric field between the second pixel electrode PXE2 and the common electrode CE.

Figure 13:
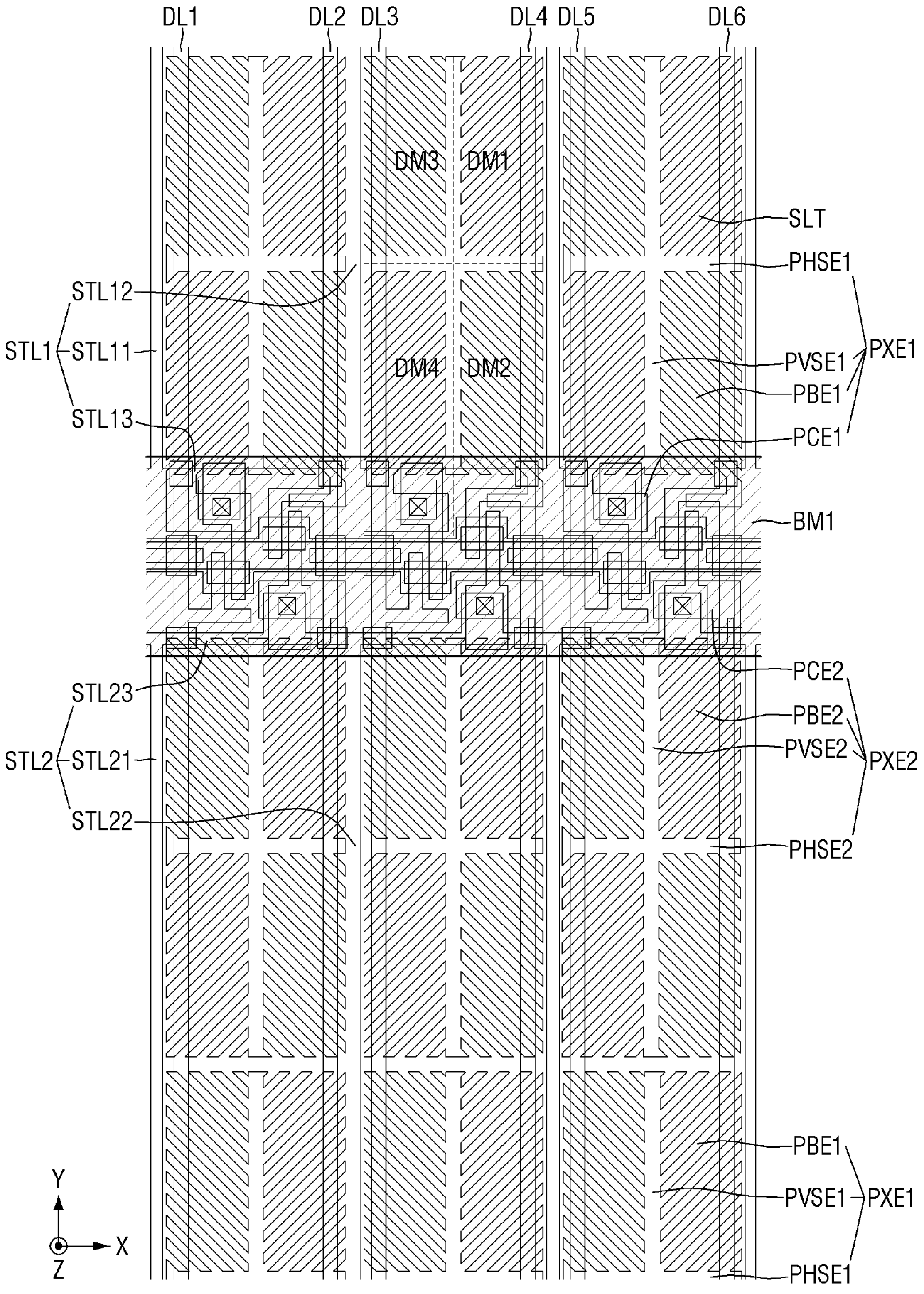
FIG. 13 is a layout view illustrating an example of the subpixels and the light blocking member of the display panel illustrated in FIG. 6.

The first light blocking member BM1 may be disposed between a lower side of the first vertical stem PVSE1 of the first pixel electrode PXE1 and an upper side of the second vertical stem PVSE2 of the second pixel electrode PXE2 as illustrated in FIG. 12. The first light blocking member BM1 may cover a part of the lower side of the first vertical stem PVSE1 of the first pixel electrode PXE1 and a part of the upper side of the second vertical stem PVSE2 of the second pixel electrode PXE2 as illustrated in FIG. 13. In this case, the first source connector SCE1 and the first branches PBE1 disposed in a part of each of second and fourth domains DM2 and DM4 of the first pixel electrode PXE1 may be covered by the first light blocking member BM1. In addition, the second source connector SCE2 and the second branches PBE2 disposed in a part of each of first and third domains DM1 and DM3 of the second pixel electrode PXE2 may be covered by the first light blocking member BM1. A length of the first light blocking member BM1 in the second direction (Y-axis direction) may be about 60 to 100 μm.

Figure 14:
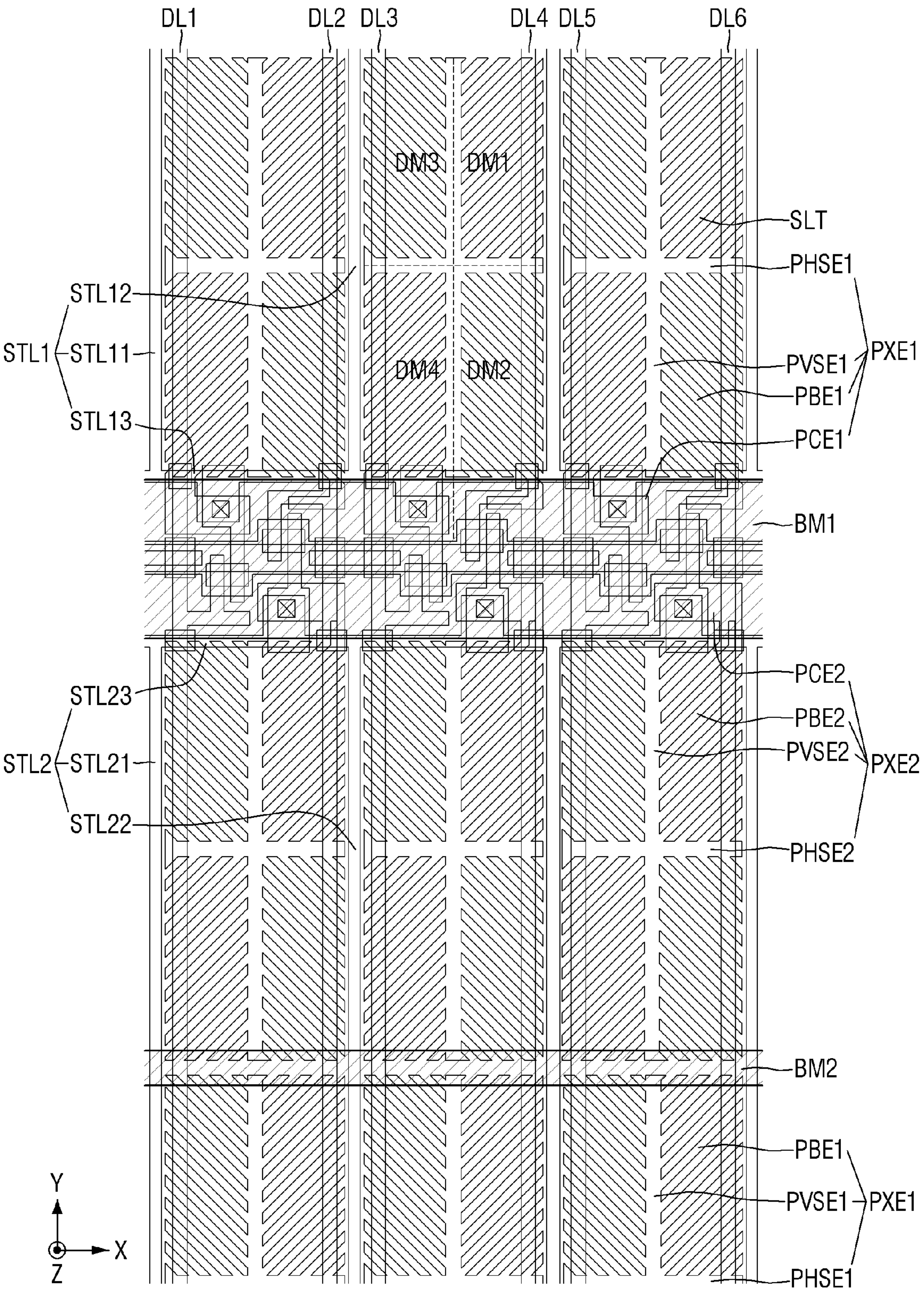
FIG. 14 is a layout view illustrating an example of the subpixels and the light blocking member of the display panel illustrated in FIG. 6.

FIG. 14 is a layout view illustrating an example of the subpixels SP1 and SP2 and the light blocking member of the display panel illustrated in FIG. 6.

The embodiment of FIG. 14 is different from the embodiment of FIG. 13 in that a second light blocking member BM2 is added between an upper side of a first pixel electrode PXE1 and a lower side of a second pixel electrode PXE2.

Referring to FIG. 14, the second light blocking member BM2 may cover a part of an upper side of a first vertical stem PVSE1 of the first pixel electrode PXE1 and a part of a lower side of a second vertical stem PVSE2 of the second pixel electrode PXE2. In this case, first branches PBE1 in a part of each of first and third domains DM1 and DM3 of the first pixel electrode PXE1 may be covered by the second light blocking member BM2 as illustrated in FIG. 14. In addition, second branches PBE2 in a part of each of second and fourth domains DM2 and DM4 of the second pixel electrode PXE2 may be covered by the second light blocking member BM2 as illustrated in FIG. 14.

A length of the second light blocking member BM2 in the second direction (Y-axis direction) may be smaller than a length of a first light blocking member BM1 in the second direction (Y-axis direction). For example, the length of the second light blocking member BM2 in the second direction (Y-axis direction) may be 10 to 40 μm. When the length of the second light blocking member BM2 in the second direction (Y-axis direction) is less than 10 μm, process difficulty may increase, thereby increasing process dispersion. Thus, the uniformity of the length of the second light blocking member BM2 in the second direction (Y-axis direction) may be reduced. In addition, when the length of the second light blocking member BM2 in the second direction (Y-axis direction) is greater than 40 μm, an opening area of a first subpixel SP1 and an opening area of a second subpixel SP2 may be reduced, thereby reducing light transmittance of the first subpixel SP1 and light transmittance of the second subpixel SP2.

Figure 15:
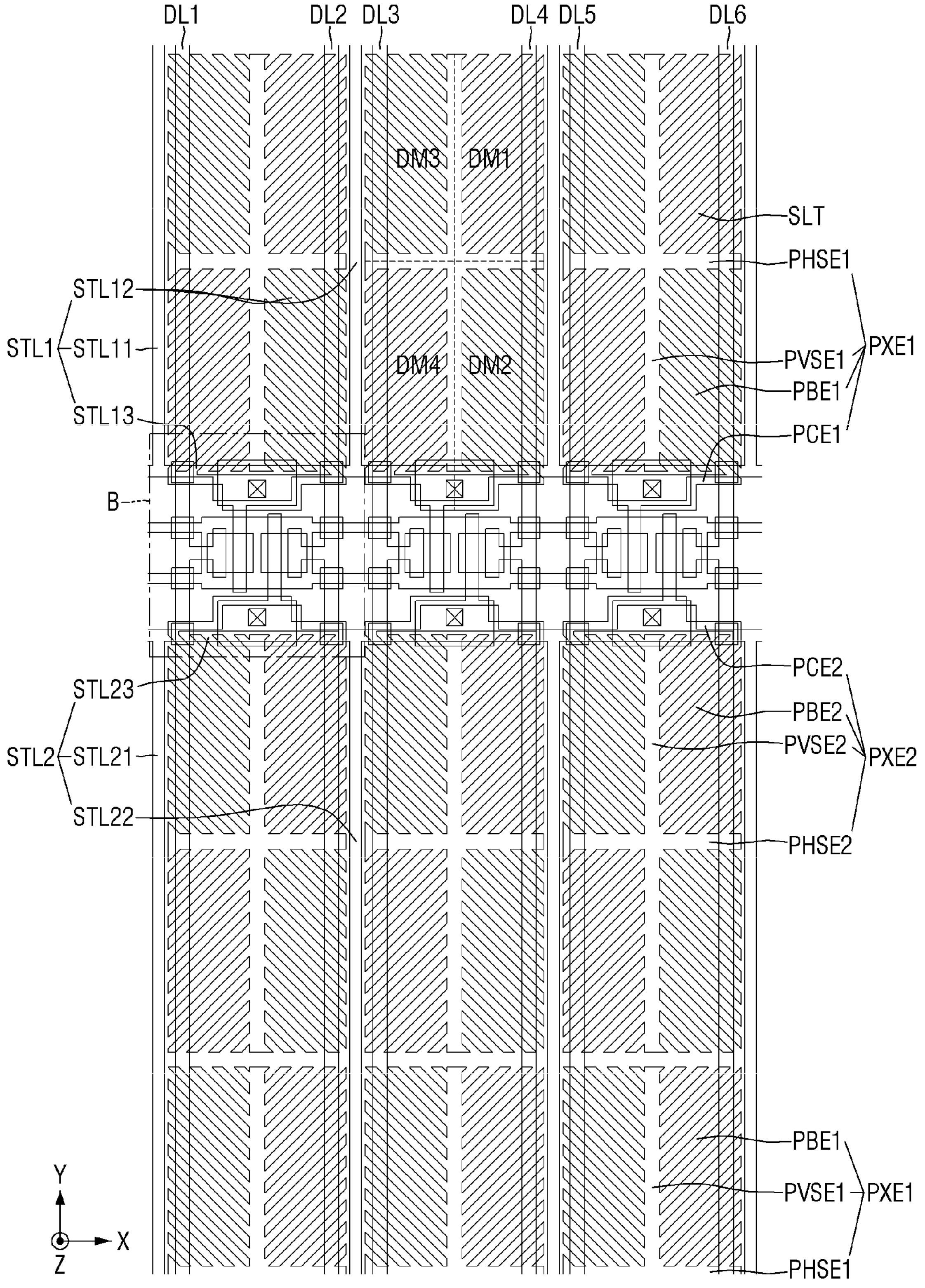
FIG. 15 is a layout view illustrating subpixel of a display panel according to an embodiment.
Figure 16:
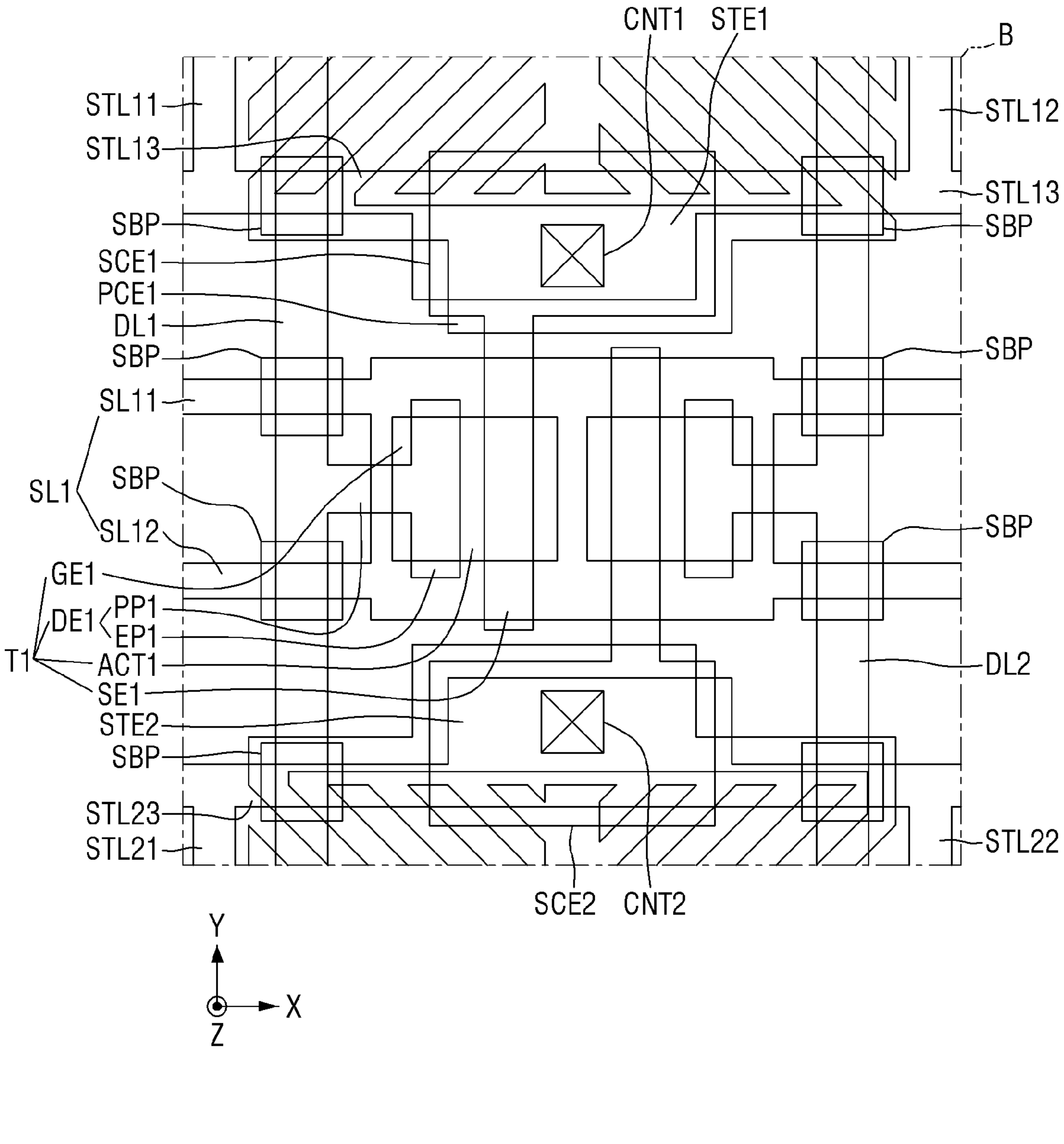
FIG. 16 is an enlarged layout view illustrating a first switching element and a first contact hole of a first subpixel and a second switching element and a second contact hole of a second subpixel of FIG. 15 in detail.

FIG. 15 is a layout view illustrating subpixels SP1 and SP2 of a display panel according to an embodiment. FIG. 16 is an enlarged layout view illustrating a first switching element T1 and a first contact hole CNT1 of a first subpixel SP1 and a second switching element T2 and a second contact hole CNT2 of a second subpixel SP2 of FIG. 15 in detail.

For ease of description, only the subpixels SP1 and SP2 connected to a first scan line SL1, and first through sixth data lines DL1 through DL6 are illustrated in FIG. 15. In FIGS. 15 and 16, a first subpixel SP1 connected to the first scan line SL1 and the first data line DL1 and a second subpixel SP2 connected to the first scan line SL1 and the second data line DL2 will be mainly described for ease of description. In addition, in FIGS. 15 and 16, a first electrode of the first switching element T1 is a first drain electrode DE1, and a second electrode is a first source electrode SE1.

Referring to FIGS. 15 and 16, the first subpixel SP1 may include the first switching element T1, a first pixel electrode PXE1, a first source connector SCE1, a first storage electrode STE1, and a first storage line STL1.

The first switching element T1 may include a first gate electrode GE1 connected to the first scan line SL1, the first source electrode SE1 connected to the first source connector SCE1, the first drain electrode DE1 connected to the first data line DL1, and a first active layer ACT1 overlapping the first gate electrode GE1.

The first switching element T1 may be substantially the same as that described above with reference to FIG. 6 except for the first gate electrode GE1 and the first drain electrode DE1.

The first gate electrode GE1 may be a part of the first scan line SL1. For example, the first gate electrode GE1 may be defined as an area of the first scan line SL1 which overlaps the first active layer ACT1.

The first drain electrode DE1 may include a first protruding part PP1 protruding from the first data line DL1 in the first direction (X-axis direction) and a first extending part EP1 extending from the first protruding part PP1 in the second direction (Y-axis direction). The first extending part EP1 may protrude from an end of the first protruding part PP1 in the second direction (Y-axis direction). The first extending part EP1 may protrude toward the first pixel electrode PXE1 and a second pixel electrode PXE2. The first protruding part PP1 may extend in the first direction (X-axis direction), and the first extending part EP1 may extend in the second direction (Y-axis direction).

The first extending part EP1 may be spaced apart from the first source electrode SE1 in the first direction (X-axis direction). The first extending part EP1 and the first source electrode SE1 may be disposed in the first direction (X-axis direction). The first source electrode SE1 and the first extending part EP1 may extend in the second direction (Y-axis direction) in an area overlapping the first active layer ACT1. An area between the first extending part EP1 and the first source electrode SE1 in the first direction (X-axis direction) may be defined as a first channel area CH1 of the first switching element T1.

The first source connector SCE1 is substantially the same as that described above with reference to FIG. 6, and thus a description thereof will be omitted.

The first storage electrode STE1 may protrude from a third sub-storage line STL13 of the first storage line STL1 in the second direction (Y-axis direction). The first storage electrode STE1 may protrude toward the second pixel electrode PXE2. The first storage electrode STE1 may also protrude toward the first pixel electrode PXE1, but the present disclosure is not limited thereto. The first storage electrode STE1 may overlap the first source connector SCE1. The first storage electrode STE1 and the first source connector SCE1 may form a first storage capacitor Cst1.

A left end of the first storage electrode STE1 may protrude further than a left end of the first source connector SCE1 in the first direction (X-axis direction), and a right end of the first source connector SCE1 may protrude further than a right end of the first storage electrode STE1 in the first direction (X-axis direction). Therefore, even if parasitic capacitance Cgs is changed by the shifting of the first source electrode SE1, the first drain electrode DE1, and the first source connector SCE1 to the left or the right due to a misalignment in a manufacturing process as described in FIGS. 9 through 11, a change in a kickback voltage ΔVp affecting the first source electrode SE1 can be prevented.

The first pixel electrode PXE1 is substantially the same as that described above with reference to FIG. 3, and thus a description thereof will be omitted. The first storage line STL1 is substantially the same as that described above with reference to FIG. 3 except that the first storage line STL1 does not include a fourth sub-storage line STL14, and thus a description thereof will be omitted.

The second subpixel SP2 may include the second switching element T2, the second pixel electrode PXE2, a second source connector SCE2, a second storage electrode STE2, and a second storage line STL2.

The second switching element T2 may include a second gate electrode GE2 connected to the first scan line SL1, a second source electrode SE2 connected to the second source connector SCE2, a second drain electrode DE2 connected to the second data line DL2, and a second active layer ACT2 overlapping the second gate electrode GE2.

The second switching element ST2 may be substantially the same as that described above with reference to FIG. 6 except for the second gate electrode GE2 and the second drain electrode DE2.

The second gate electrode GE2 may be a part of the first scan line SL1. For example, the second gate electrode GE2 may be defined as an area of the first scan line SL1 which overlaps the second active layer ACT2.

The second drain electrode DE2 may include a second protruding part PP2 protruding from the second data line DL2 in the first direction (X-axis direction) and a second extending part EP2 extending from the second protruding part PP2 in the second direction (Y-axis direction). The second extending part EP2 may protrude from an end of the second protruding part PP2 in the second direction (Y-axis direction). The second extending part EP2 may protrude toward the first pixel electrode PXE1 and the second pixel electrode PXE2. The second protruding part PP2 may extend in the first direction (X-axis direction), and the second extending part EP2 may extend in the second direction (Y-axis direction).

The second extending part EP2 may be spaced apart from the second source electrode SE2 in the first direction (X-axis direction). The second extending part EP2 and the second source electrode SE2 may be disposed in the first direction (X-axis direction). The second source electrode SE2 and the second extending part EP2 may extend in the second direction (Y-axis direction) in an area overlapping the second active layer ACT2. An area between the second extending part EP2 and the second source electrode SE2 in the first direction (X-axis direction) may be defined as a second channel area CH2 of the second switching element T2.

The first extending part EP1 of the first drain electrode DE1, the first source electrode SE1, the second source electrode SE2, and the second extending part EP2 of the second drain electrode DE2 may be disposed in the first direction (X-axis direction).

The second source connector SCE2 is substantially the same as that described above with reference to FIG. 6, and thus a description thereof will be omitted.

The second storage electrode STE2 may protrude from a third sub-storage line STL23 of the second storage line STL2 in the second direction (Y-axis direction). The second storage electrode STE2 may protrude toward the first pixel electrode PXE1, but the present disclosure is not limited thereto. The second storage electrode STE2 may also protrude toward the second pixel electrode PXE2. The second storage electrode STE2 may overlap the second source connector SCE2. The second storage electrode STE2 and the second source connector SCE2 may form a second storage capacitor Cst2.

A right end of the second storage electrode STE2 may protrude further than a right end of the second source connector SCE2 in the first direction (X-axis direction), and a left end of the second source connector SCE2 may protrude further than a left end of the second storage electrode STE2 in the first direction (X-axis direction). Therefore, even if parasitic capacitance Cgs is changed by the shifting of the second source electrode SE2, the second drain electrode DE2, and the second source connector SCE2 to the left or the right due to a misalignment in the manufacturing process as described in FIGS. 9 through 11, a change in a kickback voltage ΔVp affecting the second source electrode SE2 can be prevented by changing the capacitance of the second storage capacitor Cst2.

The second pixel electrode PXE2 is substantially the same as the first pixel electrode PXE1 of FIG. 4 except that a second pixel electrode connector PCE2 overlaps the second source connector SCE2, and thus a description thereof will be omitted. In addition, the second storage line STL2 is substantially the same as the first storage line STL1 of FIG. 4 except that the second storage line STL2 does not include a fourth sub-storage line STL24, and thus a description thereof will be omitted.

A shielding line SHL is substantially the same as that described above with reference to FIG. 6, and thus a description thereof will be omitted.

In the first subpixel SP1 and the second subpixel SP2, the first data line DL1 intersects the third sub-storage line STL13 of the first storage line STL1, a first sub-scan line SL11 and a second sub-scan line SL12 of the first scan line SL1, and the third sub-storage line STL23 of the second storage line STL2. That is, in the first subpixel SP1 and the second subpixel SP2, the first data line DL1 intersects four lines. Therefore, the number of intersections of the first data line DL1 and the storage lines STL1 and STL2 may be reduced in the embodiment illustrated in FIG. 15 compared with the embodiment illustrated in FIG. 4. Accordingly, short circuits between the first data line DL1 and the storage lines STL1 and STL2 due to particles may be reduced, thereby increasing the manufacturing yield of the display panel.

As illustrated in FIG. 15, the first switching element T1 and the first contact hole CNT1 may be disposed in the second direction (Y-axis direction), and the second switching element T2 and the second contact hole CNT2 may be disposed in the second direction (Y-axis direction). For example, the first active layer ACT1 of the first switching element T1 and the first contact hole CNT1 may be disposed in the second direction (Y-axis direction). The second active layer ACT2 of the second switching element T2 and the second contact hole CNT2 may be disposed in the second direction (Y-axis direction).

In addition, the first switching element T1 and the second switching element T2 may be disposed in the first direction (X-axis direction). The first switching element T1 and the second switching element T2 may be disposed between the first contact hole CNT1 and the second contact hole CNT2 in the second direction (Y-axis direction). For example, the first active layer ACT1 of the first switching element T1 and the second active layer ACT2 of the second switching element T2 may be disposed between the first contact hole CNT1 and the second contact hole CNT2 in the second direction (Y-axis direction).

Further, the first pixel electrode PXE1 and the second pixel electrode PXE2 may be disposed in the second direction (Y-axis direction).

In this case, when any one of the first switching element T1 and the second switching element T2 is determined to be defective, it can be easily repaired. For example, when the first switching element T1 is defective, the electrical connection between the first source electrode SE1 of the first switching element T1 and the first pixel electrode PXE1 may be cut using a laser, and a pixel connection electrode connecting the first pixel electrode PXE1 and the second pixel electrode PXE2 may be added using an inkjet process. In this case, the inkjet process may be simple because the pixel connection electrode only needs to extend in the second direction (Y-axis direction).

Alternatively, when the second switching element T2 is defective, the electrical connection between the second source electrode SE2 of the second switching element T2 and the second pixel electrode PXE2 may be cut using a laser, and a pixel connection electrode connecting the first pixel electrode PXE1 and the second pixel electrode PXE2 may be added using an inkjet process. In this case, the inkjet process may be simple because the pixel connection electrode only needs to extend in the second direction (Y-axis direction).

Figure 17:
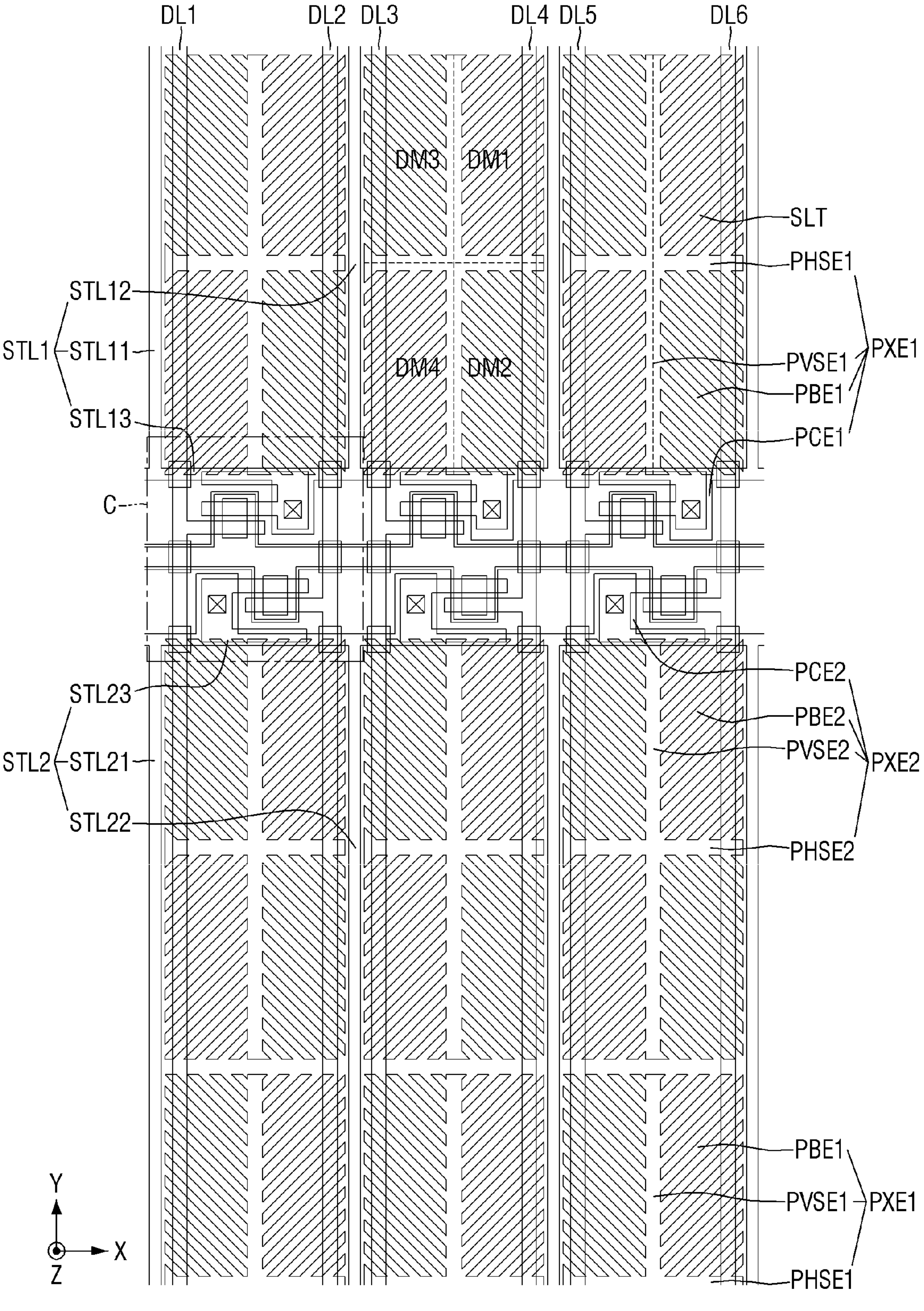
FIG. 17 is a layout view illustrating subpixel of a display panel according to an embodiment.
Figure 18:
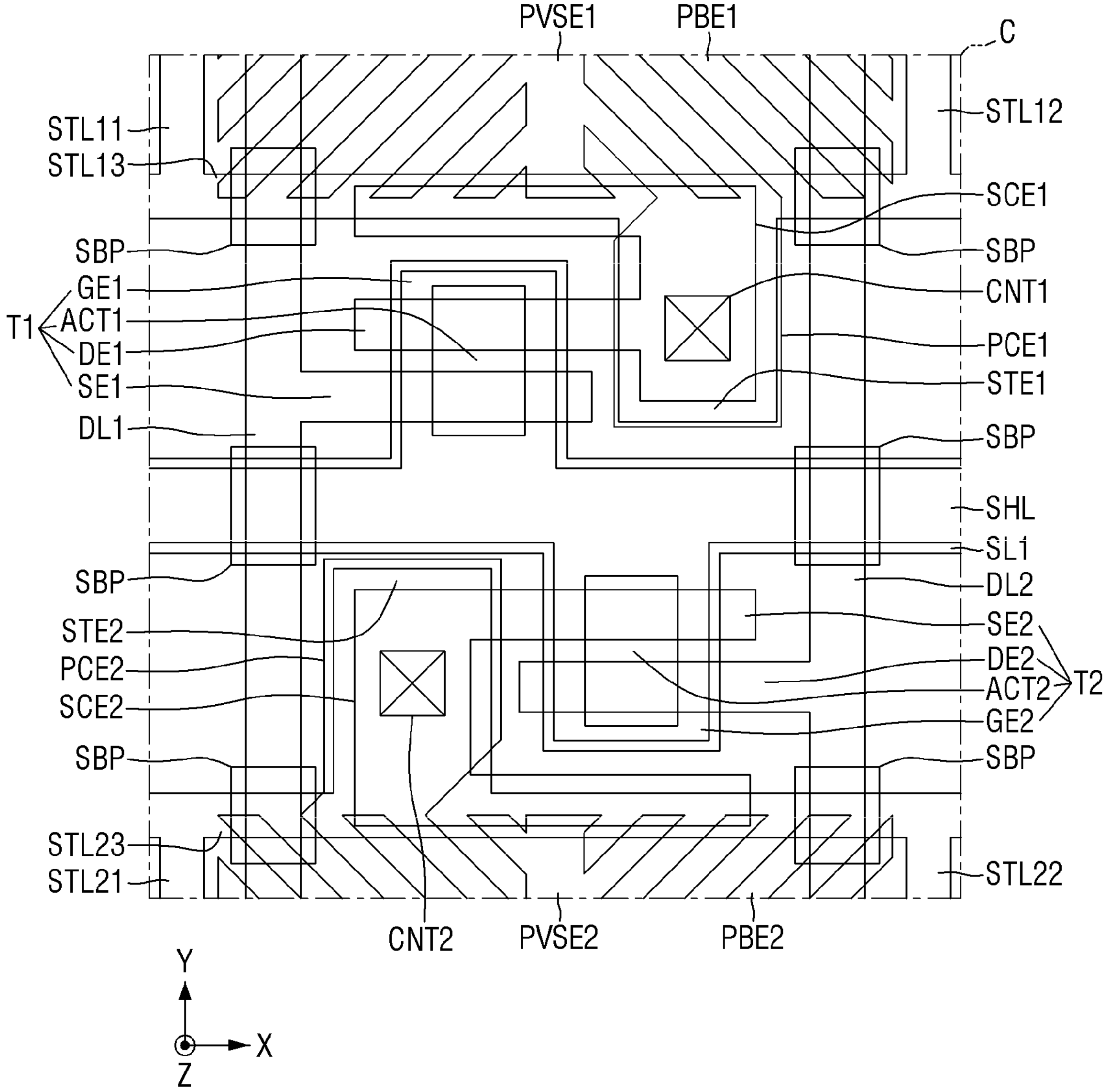
FIG. 18 is an enlarged layout view illustrating a first switching element and a first contact hole of a first subpixel and a second switching element and a second contact hole of a second subpixel of FIG. 17 in detail.

FIG. 17 is a layout view illustrating subpixels SP1 and SP2 of a display panel according to an embodiment. FIG. 18 is an enlarged layout view illustrating a first switching element T1 and a first contact hole CNT1 of a first subpixel SP1 and a second switching element T2 and a second contact hole CNT2 of a second subpixel SP2 of FIG. 17 in detail.

For ease of description, only the subpixels SP1 and SP2 connected to a first scan line SL1, and first through sixth data lines DL1 through DL6 are illustrated in FIG. 17. In FIGS. 17 and 18, a first subpixel SP1 connected to the first scan line SL1 and the first data line DL1 and a second subpixel SP2 connected to the first scan line SL1 and the second data line DL2 will be mainly described for ease of description. In addition, in FIGS. 17 and 18, a first electrode of the first switching element T1 is a first drain electrode DE1, and a second electrode is a first source electrode SE1.

Referring to FIGS. 17 and 18, the first subpixel SP1 may include the first switching element T1, a first pixel electrode PXE1, a first source connector SCE1, a first storage electrode STE1, and a first storage line STL1.

The first switching element T1 may include a first gate electrode GE1 connected to the first scan line SL1, the first source electrode SE1 connected to the first source connector SCE1, the first drain electrode DE1 connected to the first data line DL1, and a first active layer ACT1 overlapping the first gate electrode GE1.

The first gate electrode GE1 may protrude from the first scan line SL1 in the second direction (Y-axis direction). The first gate electrode GE1 may protrude from the first scan line SL1 toward the first pixel electrode PXE1.

The first active layer ACT1 may overlap not only the first gate electrode GE1 but also the first source electrode SE1 and the first drain electrode DE1. The first active layer ACT1 may have a quadrangular planar shape, but the present disclosure is not limited thereto.

The first source electrode SE1 may protrude from the first source connector SCE1 in the first direction (X-axis direction). The first source electrode SE1 may protrude from the first source connector SCE1 toward the first data line DL1. The first source electrode SE1 may extend in the first direction (X-axis direction).

The first drain electrode DE1 may protrude from the first data line DL1 in the first direction (X-axis direction). The first drain electrode DE1 may protrude from the first data line DL1 toward the second data line DL2. The first drain electrode DE1 may extend in the first direction (X-axis direction).

The first source electrode SE1 and the first drain electrode DE1 may extend in the first direction (X-axis direction) in an area overlapping the first active layer ACT1. An area between the first source electrode SE1 and the first drain electrode DE1 in the second direction (Y-axis direction) may be defined as a first channel area CH1 of the first switching element T1.

The first source connector SCE1 and the first storage electrode STE1 are substantially the same as those described above with reference to FIG. 6, and thus a description thereof will be omitted.

A lower end of the first storage electrode STE1 may protrude further than a lower end of the first source connector SCE1 in the second direction (Y-axis direction), and an upper end of the first source connector SCE1 may protrude further than an upper end of the first storage electrode STE1 in the second direction (Y-axis direction). Therefore, even if parasitic capacitance Cgs is changed by the upward or downward shifting of the first source electrode SE1, the first drain electrode DE1, and the first source connector SCE1 due to a misalignment in a manufacturing process similarly to the description of FIGS. 9 through 11, a change in a kickback voltage $\Delta Vp$ affecting the first source electrode SE1 can be prevented by changing the capacitance of a first storage capacitor Cst1.

The first pixel electrode PXE1 is substantially the same as that described above with reference to FIG. 3, and thus a description thereof will be omitted. The first storage line STL1 is substantially the same as that described above with reference to FIG. 3 except that the first storage line STL1 does not include a fourth sub-storage line STL14, and thus a description thereof will be omitted.

The second subpixel SP2 may include the second switching element T2, a second pixel electrode PXE2, a second source connector SCE2, a second storage electrode STE2, and a second storage line STL2.

The second switching element T2 may include a second gate electrode GE2 connected to the first scan line SL1, a second source electrode SE2 connected to the second source connector SCE2, a second drain electrode DE2 connected to the second data line DL2, and a second active layer ACT2 overlapping the second gate electrode GE2.

The second gate electrode GE2 may protrude from the first scan line SL1 in the second direction (Y-axis direction). The second gate electrode GE2 may protrude from the first scan line SL1 toward the second pixel electrode PXE2.

The second active layer ACT2 may overlap not only the second gate electrode GE2 but also the second source electrode SE2 and the second drain electrode DE2. The second active layer ACT2 may have a quadrangular planar shape, but the present disclosure is not limited thereto.

The second source electrode SE2 may protrude from the second source connector SCE2 in the first direction (X-axis direction). The second source electrode SE2 may protrude from the second source connector SCE2 toward the second data line DL2. The second source electrode SE2 may extend in the first direction (X-axis direction).

The second drain electrode DE2 may protrude from the second data line DL2 in the first direction (X-axis direction). The second drain electrode DE2 may protrude from the second data line DL2 toward the first data line DL1. The second drain electrode DE2 may extend in the first direction (X-axis direction).

The second source electrode SE2 and the second drain electrode DE2 may extend in the first direction (X-axis direction) in an area overlapping the second active layer ACT2. An area between the second source electrode SE2 and the second drain electrode DE2 in the second direction (Y-axis direction) may be defined as a second channel area CH2 of the second switching element T2.

The second source connector SCE2 and the second storage electrode STE2 are substantially the same as those described above with reference to FIG. 6, and thus a description thereof will be omitted.

An upper end of the second storage electrode STE2 may protrude further than an upper end of the second source connector SCE2 in the second direction (Y-axis direction), and a lower end of the second source connector SCE2 may protrude further than a lower end of the second storage electrode STE2 in the second direction (Y-axis direction). Therefore, even if parasitic capacitance Cgs is changed by the upward or downward shifting of the second source electrode SE2, the second drain electrode DE2, and the second source connector SCE2 due to a misalignment in the manufacturing process similarly to the description of FIGS. 9 through 11, a change in a kickback voltage $\Delta Vp$ affecting the second source electrode SE2 can be prevented by changing the capacitance of a second storage capacitor Cst2.

The second pixel electrode PXE2 is substantially the same as the first pixel electrode PXE1 of FIG. 4 except that a second pixel electrode connector PCE2 overlaps the second source connector SCE2, and thus a description thereof will be omitted. In addition, the second storage line STL2 is substantially the same as the first storage line STL1 of FIG. 4 except that the second storage line STL2 does not include a fourth sub-storage line STL24, and thus a description thereof will be omitted.

A shielding line SHL is substantially the same as that described above with reference to FIG. 6, and thus a description thereof will be omitted.

In the first subpixel SP1 and the second subpixel SP2, the first data line DL1 intersects a third sub-storage line STL13 of the first storage line STL1, a first sub-scan line SL11 and a second sub-scan line SL12 of the first scan line SL1, and a third sub-storage line STL23 of the second storage line STL2. That is, in the first subpixel SP1 and the second subpixel SP2, the first data line DL1 intersects four lines. Therefore, the number of intersections of the first data line DL1 and the storage lines STL1 and STL2 may be reduced in the embodiment illustrated in FIG. 17 compared with the embodiment illustrated in FIG. 4. Accordingly, short circuits between the first data line DL1 and the storage lines STL1 and STL2 due to particles may be reduced, thereby increasing the manufacturing yield of the display panel.

As illustrated in FIG. 17, the first switching element T1 and the first contact hole CNT1 may be disposed in the first direction (X-axis direction), and the second switching element T2 and the second contact hole CNT2 may be disposed in the first direction (X-axis direction). For example, at least any one of the first active layer ACT1 and the first drain electrode DE1 of the first switching element T1 and the first contact hole CNT1 may be disposed in the first direction (X-axis direction). At least any one of the second active layer ACT2 and the second drain electrode DE2 of the second switching element T2 and the second contact hole CNT2 may be disposed in the first direction (X-axis direction).

In addition, the first switching element T1 and the second contact hole CNT2 may be disposed in the second direction (Y-axis direction). For example, at least any one of the first active layer ACT1, the first source electrode SE1 and the first drain electrode DE1 of the first switching element T1 and the second contact hole CNT2 may be disposed in the second direction (Y-axis direction). The second switching element T2 and the first contact hole CNT1 may be disposed in the second direction (Y-axis direction). For example, at least any one of the second active layer ACT2, the second source electrode SE2 and the second drain electrode DE2 of the second switching element T2 and the first contact hole CNT1 may be disposed in the second direction (Y-axis direction).

Further, the first pixel electrode PXE1 and the second pixel electrode PXE2 may be disposed in the second direction (Y-axis direction).

The current disclosure should not be construed as being limited to the embodiments set forth herein. Rather, these embodiments are provided so that this disclosure will be thorough and complete and will fully convey the concept of the inventive concept to those skilled in the art.

While the current disclosure have been particularly shown and described with reference to some embodiments thereof, it will be understood by one of ordinary skill in the art that various changes in form and detail may be made therein without departing from the spirit and scope of the current disclosure as defined by the following claims.

What is claimed is:

1. A display device comprising:

a substrate;

scan lines disposed on the substrate and extending along a first direction;

data lines disposed on the substrate and extending along a second direction that intersects the first direction;

a first switching element including a first active area, a first gate electrode connected to a first scan line among the scan lines, a first drain electrode connected to a first data line among the data lines, and a first source electrode facing the first drain electrode;

a first pixel electrode connected to the first source electrode of the first switching element;

a first source connector which extends from the first source electrode and is connected to the first pixel electrode through a first contact hole;

a first storage electrode which overlaps the first source connector in a plan view and is connected to a storage voltage line to which a storage voltage is applied, a second switching element including a second active area, a second gate electrode connected to the first scan line, the second drain electrode connected to a second data line among the data lines, and a second source electrode facing the second drain electrode;

a second pixel electrode connected to the second source electrode of the second switching element; and a second source connector which extends from the second source electrode and is connected to the second pixel electrode through a second contact hole, wherein one edge of the first storage electrode protrudes further in the first direction or the second direction than one edge of the first source connector, wherein the first storage electrode includes a first sub-storage line extending along the first direction and a second sub-storage line extending along the second direction, wherein the first switching element overlaps the first contact hole in the first direction in a plan view, and the second switching element overlaps the second contact hole in the first direction in a plan view, wherein the second switching element and the first contact hole are arranged in the second direction in a plan view, wherein the first switching element and the second contact hole are arranged in the second direction in a plan view, and wherein the first scan line is disposed between the second switching element and the first contact hole and between the first switching element and the second contact hole in the second direction in a plan view.

2. The display device of claim 1, wherein the one edge of the first storage electrode is an edge of the first storage electrode which is closest to the first scan line and the one edge of the first source connector is an edge of the first source connector which is closest to the first scan line.

3. The display device of claim 1, wherein the first source connector includes a first portion extending from the first source electrode along the second direction and a second portion extending from the first portion along the first direction.

4. The display device of claim 1, wherein the second portion is disposed between the first source electrode and the first pixel electrode.

5. The display device of claim 1, wherein the first source connector and the first pixel electrode are connected through the first contact hole.

6. The display device of claim 1, wherein the first pixel electrode includes a body portion and a pixel electrode connector extending from the body portion, and wherein the first portion of the first source connector, the first storage electrode, and the pixel electrode connector overlap each other in an area disposed between the first scan line and the body portion of the first pixel electrode.

7. The display device of claim 1, wherein the first contact hole and one of the first active area and the first drain electrode of the first switching element are arranged in the first direction.

* * * * *